(12) United States Patent
Augusto

(10) Patent No.: US 6,891,869 B2
(45) Date of Patent: May 10, 2005

(54) WAVELENGTH-SELECTIVE PHOTONICS DEVICE

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 432 days.

(21) Appl. No.: 10/023,430

(22) Filed: Dec. 14, 2001

(65) Prior Publication Data

US 2002/0101895 A1 Aug. 1, 2002

Related U.S. Application Data

(63) Continuation-in-part of application No. PCT/EP00/05590, filed on Jun. 13, 2000.
(60) Provisional application No. 60/140,671, filed on Jun. 14, 1999.

(51) Int. Cl.[7] .............................................. H01S 5/00
(52) U.S. Cl. ........................................................ 372/43
(58) Field of Search ....................... 372/43–50; 257/99, 257/190; 359/263

(56) References Cited

U.S. PATENT DOCUMENTS

| | | | |
|---|---|---|---|
| 4,705,361 A | 11/1987 | Frazier et al. | 359/263 |
| 4,975,567 A | 12/1990 | Bishop et al. | 250/214.1 |
| 5,689,123 A | 11/1997 | Major et al. | 257/190 |
| 5,696,389 A | * 12/1997 | Ishikawa et al. | 257/99 |

* cited by examiner

Primary Examiner—Quyen Leung
(74) Attorney, Agent, or Firm—Barry R. Lipsitz; Douglas M. McAllister

(57) ABSTRACT

A device comprising a number of different wavelength-selective active-layers arranged in a vertical stack, having band-alignment and work-function engineered lateral contacts to said active-layers, consisting of a contact-insulator and a conductor-insulator. Photons of different energies are selectively absorbed in or emitted by the active-layers. Contact means are arranged separately on the lateral sides of each layer or set of layers having the same parameters for extracting charge carriers generated in the photon-absorbing layers and/or injecting charge carriers into the photon-emitting layers. The device can be used for various applications: wavelength-selective multi-spectral solid-state displays, image-sensors, light-valves, light-emitters, etc. It can also be used for multiple-band gap solar-cells. The architecture of the device can be adapted to produce coherent light.

11 Claims, 30 Drawing Sheets wavelength-selective photonics
device

The present application is a continuation-in-part of international application number PCT/EP00/05590 filed on Jun. 13, 2000, which claims the benefit of U.S. provisional patent application No. 60/140,671 filed on Jun. 14, 1999.

FIELD OF THE INVENTION

The present invention relates to the field of opto-electronic or photonic devices, including photon-absorption (or detection), suppression of photon-absorption, and photon-emission processes

BACKGROUND OF THE INVENTION

Historically, the preferred materials to implement opto-electronic or photonic devices have been materials with direct band-gaps. This fact is related to the significantly higher efficiency of such materials for light emission and/or absorption, for opto-electronic processes involving transitions across the band-gap.

Silicon-based opto-electronic devices have consisted mainly of photo-detectors, such as Charge Coupled Devices (CCDs) and CMOS photo-gates or photo-diodes, for cost-sensitive products, and/or products requiring very large density of components.

Since the band-structure of silicon makes these devices suitable for operation across the visible spectrum, CCDs and CMOS image-sensors have been incorporated into digital cameras and camcorders. Another very important silicon opto-electronic device for cost sensitive applications, has been the Solar-Cell.

Photo-detectors for the technologically important wavelengths in the infrared, such as $\lambda$=1310 nm and $\lambda$=1550 nm, are not possible with silicon and have been fabricated with compound semiconductor materials, such as the III/V materials. These materials have also provided the solutions for high-performance opto-electronic applications, such as fiber optic communications, with heterojunction detectors and lasers.

In spite of continued research efforts, efficient light emission has remained an elusive prospect for silicon devices and technologies, due to the indirect band-gap of silicon. It was only fairly recently that efficient light absorption and emission, including lasers, were achieved with devices whose operating principles made them independent of the band-gap type and magnitude. Examples of these devices are the Quantum Well Infrared Photo-detector (QWIP) and the Quantum Cascade Laser (QCL) respectively.

Band-gap engineering is also possible in the silicon materials system with $Si_{1-x}Ge_x$ (SiGe) and/or $Si_{1-x-y}Ge_xC_y$ (SiGeC) films strained to the silicon lattice. However, the band offsets are small compared to those of the III/V materials, thereby limiting the energy of the opto-electronic transitions between bound states, that is, limiting the range of wavelengths for device operation.

SUMMARY OF THE INVENTION

It is an object of the present invention to provide a novel photonic device architecture, where charge carrier injection/extraction into/from the device, is fully decoupled from the band-alignment engineering determining the energy of the photons absorbed and/or emitted in said device.

The device architecture according to this invention comprises a stack of different active-layers sandwiched between barrier-layers, and lateral contacts for charge carrier injection/extraction into/from the active-layers. The lateral contacts can be made individually to a single active-layer, or a set of active-layers, identical or not, can have common contacts. It can also be envisaged that one contact type is common to several active-layers, while the other contact type is made separately to each of those active-layers.

It is another object of the present invention to provide said novel photonic device architecture where contacts, through which charge carriers are injected/extracted into/from the device, are engineered with respect to band-alignment and work-function, thereby enabling:

a) Selective injection and/or extraction of electrons only, or of holes only.
b) Selective injection/extraction of electrons or holes into/from a chosen energy level (subband) only, without injection or extraction into/from other energy levels (subbands).

It is yet another object of the present invention to provide said novel photonic device architecture, for operation by Inter-Band opto-electronic transitions, which for photon-absorption act as "low-pass filters" for electromagnetic radiation. Wavelength-selectivity is achieved by stacking a sequence of active-layers and barrier-layers, with monotonically decreasing band-gaps, for monotonically increasing cutoff wavelength, or conversely for monotonically decreasing photon energy. Light penetrates the layer stack through the active-layer with the largest band-gap.

It is yet another object of the present invention to provide said novel photonic device architecture, for operation by Inter-Subband opto-electronic transitions, which for photon-absorption act as the opposite of "band-pass filters". Wavelength selectivity is achieved by having opto-electronic transitions between subbands in the valence-band and subbands in the conduction-band. Therefore there is no requirement for monotonic ordering of the active-layers, according to energy of the opto-electronic transition (photon energy).

It is yet another object of the present invention to provide said novel photonic device architecture, for operation by Intra-Subband opto-electronic transitions, which for photon-absorption act as the opposite of "band-pass filters". Wavelength selectivity is achieved by having opto-electronic transitions between subbands within the same band, valence or conduction. Therefore there is no requirement for ordering of the active-layers, according to energy of the opto-electronic transition (energy of the photons).

It is yet another object of the present invention to provide said novel photonic device architecture, for operation by Inter-Subband or Intra-Subband opto-electronic transitions, where said transitions can be photon-absorption, or suppression of photon-absorption, or photon-emission, through the control of an applied voltage to the lateral contacts.

For an active-layer operating with Intra-Subband Transitions, only one type of charge carriers, electrons or holes, is injected and extracted from each active-layer.

For photon-absorption, the lateral contacts are reverse biased, that is, electrons (holes) are injected into the "ground-state" subband in the conduction (valence) band, and are extracted from the "excited-state" subband, also in the conduction (valence) band, after undergoing a transition between those two subbands, during which a photon is absorbed.

For suppression of photon-absorption, the lateral contacts are biased for near "flat-band condition", in which electrons (holes) are not injected into the "ground-state" subband in the conduction (valence) band, thereby "depopulating it". Without charge carriers in the "ground state" subband, it is not possible for photons to be absorbed.

For photon-emission, the lateral contacts are forward biased, that is, electrons (holes) are injected into the "excited-state" subband in the conduction (valence) band, and are extracted from the "ground-state" subband also in the conduction (valence) band, after undergoing a transition between those two subbands, during which a photon is emitted.

For an active-layer operating with Inter-Subband Transitions, both types of charge carriers, electrons and holes, are injected and/or extracted into each active-layer. As it is well known, for this type of transition, the efficiency for photon absorption and/or emission is strongly impacted by the nature (direct or indirect) of the band-gap of the active-layer.

For photon-absorption, the lateral contacts are reverse biased, that is, electrons are extracted from a chosen subband in the conduction band. At the same time, holes are extracted from a chosen subband in the valence band, which can be seen as the equivalent of electrons being injected into this particular subband in the valence-band. The absorption of photons, scatters electrons from a subband in the valence-band, to a subband in the conduction-band, thereby generating electron-hole pairs.

For suppression of photon-absorption, the lateral contacts are biased for near "flat-band condition", in which electrons are not extracted from the chosen subband in the conduction-band and holes are not extracted (electrons are not injected) from the chosen subband in the valence-band. With the subband in the valence-band depleted of electrons, it is not possible for photons to be absorbed.

For photon-emission the lateral contacts are forward biased, that is, electrons are injected into a chosen subband in the conduction-band. At the same time, holes are injected into a chosen subband in the valence-band, which can be seen as the equivalent of electrons being extracted from this particular subband in the valence-band. The recombination of electrons and holes in the active-layer results in the emission of photons.

It is yet another object of the present invention to provide said novel photonic device architecture which in photon-absorption mode of operation, overcomes several of the limitations of photo-detector devices using known CCD and CMOS technologies.

It is yet another object of the present invention to provide said novel photonic device architecture that in photon-emission mode of operation, is usable in high performance systems requiring the use of LEDs and/or LASERs.

It is yet another object of the present invention to provide said novel photonic device architecture that through the applied external voltage controlling opacity (absorption) and transparency (suppression of absorption) can perform the functionality of a Wavelength-Selective "Light-Valve".

It is yet another object of the present invention to provide said novel photonic device architecture, operating as a "Wavelength-Selective Light-Valve", which can be combined with "Wavelength-Selective Reflectors", in such a way as to form "Wavelength-Selective Reflective Displays", and optical communications systems.

The wavelength selectivity, that is, the selectivity in photon-absorption or photon-emission by the active-layers, in accordance with photon energy, can be realized in different ways. Selecting and/or adjusting the parameters that control the wavelength selectivity of the active-layers in the stack, permits the implementation of devices operating in the visible spectrum, as well as in the infrared and ultra-violet, that suit a wide range of needs or applications.

The device architecture concept of the invention allows implementing high-performance photo-electric and opto-electronic devices independently of the choice of any materials system. However, due to the obvious and economic relevance of silicon technology, the invention will be described in more detail with reference to layers compatible with silicon.

These and other features and advantages of the invention will become more apparent from the following description and the accompanying drawings.

BRIEF DESCRIPTION OF THE DRAWINGS

FIG. 3A shows the band-diagram of a cross-sectional cut along the direction of epitaxial deposition (vertical direction).

FIG. 3B shows the band-diagram for one of the active-layers, of a cross-sectional cut along the direction between the two contacts (horizontal direction). The depicted "flat-band bias" condition is suitable for neither photon-absorption nor photon-emission, under which the device is transparent to all wavelengths.

FIG. 3C shows the band-diagram for one of the active-layers, of a cross-sectional cut along the direction between the two contacts (horizontal direction). The depicted "reverse bias" condition is suitable for Wavelength-Selective photon-absorption, under which the device is opaque to selected wavelengths, while transparent to all others.

FIG. 3D shows the band-diagram for one of the active-layers, of a cross-sectional cut along the direction between the two contacts (horizontal direction). The depicted "forward bias" condition is suitable for Wavelength-Selective photon-emission, under which the device is transparent to all other wavelengths.

FIG. 4A shows the band-diagram of a cross-sectional cut along the direction of epitaxial deposition (vertical direction);

FIG. 4B shows the band-diagram for one of the active-layers, of a cross-sectional cut along the direction between the two contacts (horizontal direction). The depicted "flat-band bias" condition is suitable for neither photon-absorption nor photon-emission, of which the device is transparent to all wavelengths;

FIG. 4C shows the band-diagram for one of the active-layers, of a cross-sectional cut along the direction between the two contacts (horizontal direction). The depicted "reverse bias" condition is suitable for Wavelength-Selective photon-absorption, of which the device is opaque to selected wavelengths, while transparent to all others;

FIG. 4D shows the band-diagram for one of the active-layers, of a cross-sectional cut along the direction between the two contacts (horizontal direction). The depicted "forward bias" condition is suitable for Wavelength-Selective photon-emission, of which the device is transparent to all other wavelengths;

FIG. 5A shows the band-diagram of a cross-sectional cut along the direction of epitaxial deposition (vertical direction);

FIG. 5B shows the band-diagram for one of the active-layers, of a cross-sectional cut along the direction between the two contacts (horizontal direction). The depicted "flat-band bias" condition is suitable for neither photon-absorption nor photon-emission, of which the device is transparent to all wavelengths;

FIG. 5C shows the band-diagram for one of the active-layers, of a cross-sectional cut along the direction between the two contacts (horizontal direction). The depicted "reverse bias" condition is suitable for Wavelength-Selective photon-absorption, of which the device is opaque to selected wavelengths, while transparent to all others;

FIG. 5D shows the band-diagram for one of the active-layers, of a cross-sectional cut along the direction between the two contacts (horizontal direction). The depicted "forward bias" condition is suitable for Wavelength-Selective photon-emission, of which the device is transparent to all other wavelengths;

FIG. 7A shows a schematic of the stacked color Image-Sensor operating through Inter-Band Transitions (abbreviated as "IBT"), including the lateral contacts. The basic device physics is depicted in FIG. 2D;

FIG. 7B shows the layers in the stack of FIG. 7A, together with the corresponding band-gap sequence and wavelength selectivity thereof;

FIG. 7C shows a schematic of the stacked color Image-Sensor, including the lateral contacts, operating through Inter-Subband Transitions, and/or Intra-Subband Transitions (both abbreviated as "IST"). The basic device physics is depicted in FIGS. 3C, 4C and 5C. Depending on the energy of the photons, the detection, through Inter-Subband Transitions from the valence-band to the conduction-band; Intra-Subband Transitions within the conduction-band; or through Intra-Subband Transitions within the valence-band of the active-layers.

FIG. 7D shows the layers in the stack of FIG. 7C, together with the corresponding band-gap sequence and wavelength selectivity thereof

FIG. 9A shows the layer stack of Wavelength-Selective Light-Valves combined with Wavelength-Reflectors made with Photonic Band-Gap (PBG) materials. The design of the Light-Valves and the Reflectors for operation with wavelengths in the visible range enables the fabrication of solid-state reflection displays. The design of the Light-Valves and Reflectors for operation in the Infra-Red enables the fabrication of opto-electronic components such as Optical Routers. Light-Valves with lateral dimensions considerably smaller than the wavelength of the photons to interact with, enable the dynamic formation of diffraction patterns, in which case it becomes possible to do "wavefront engineering", resulting in the capability to perform "beam shaping" and "beam steering".

FIG. 9B shows an exemplary way to implement an optical router using Wavelength-Selective Light-Valves and Wavelength-Selective Reflectors made with Photonic Band-Gap (PBG) materials. This implementation differs from that of FIG. 9A in that light is coupled to the WASP Light-Valves through a waveguide rather than through free space.

DETAILED DESCRIPTION OF THE INVENTION

Advanced thin-film deposition techniques, such as Molecular Beam Epitaxy (MBE) and Atomic Layer Deposition (ALD) for example, enable the fabrication of very sophisticated doping and heterojunction profiles in the direction of epitaxial growth. Quantum Wells (QWs) require reduced dimensionality in one direction only, and for that reason are then easy to be made with such techniques. Quantum Wires and Quantum Dots require "reduced dimensionality" in two or three directions, respectively. Therefore, examples of quantized structures will, by default, mean Quantum Wells. However, this should not be seen as a conceptual limitation. If and when it becomes equally easy to fabricate Quantum Wires and Quantum Dots, the same concepts can (with suitable adaptations) also be used to implement these new device concepts, which can use and take advantage of quantization in more dimensions.

Figure 1A:
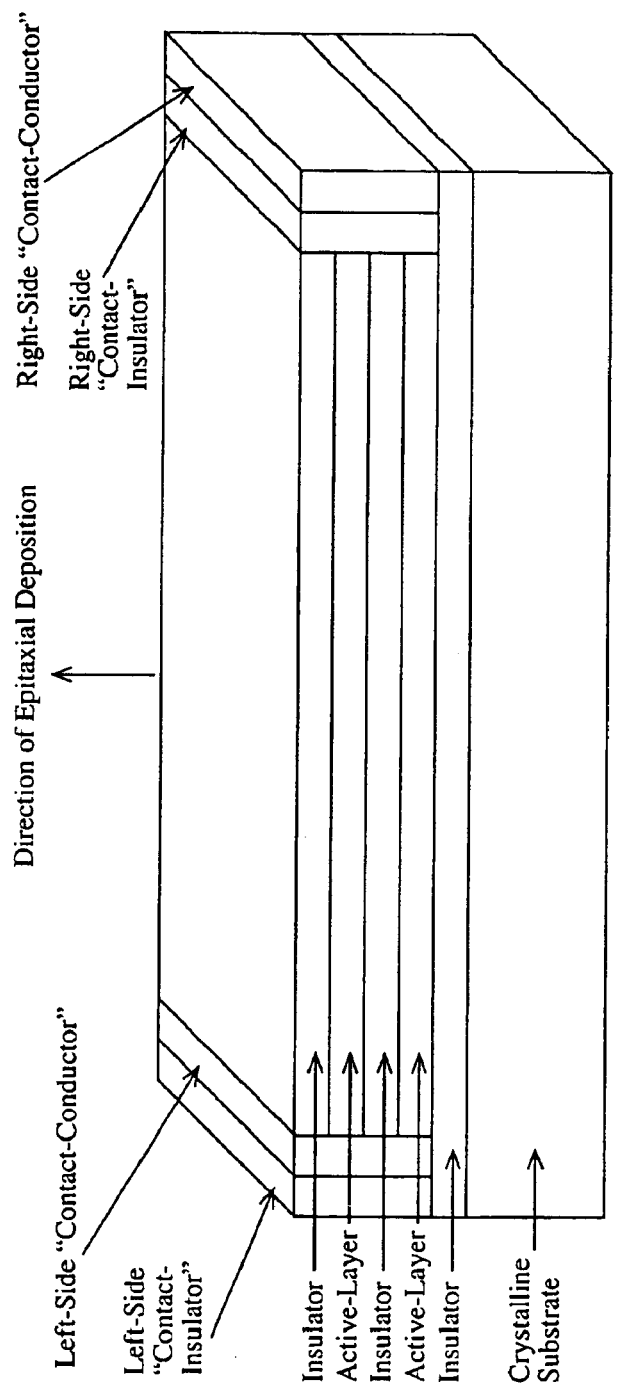
FIG. 1A shows a schematic cross-sectional view of the device architecture according to the present invention, showing a two Quantum Wells with the same "Left Bi-Layer Contact" and the same "Right Bi-Layer Contact".
Figure 1B:
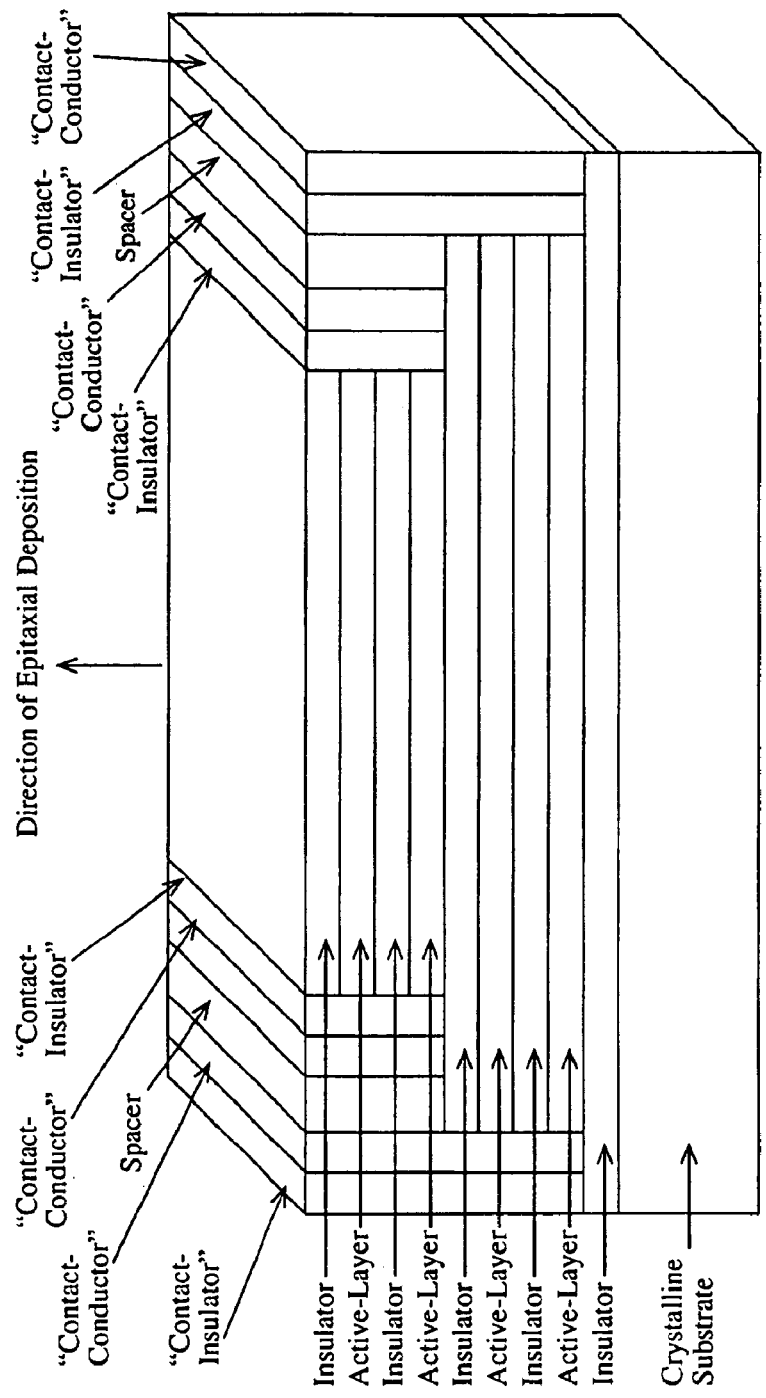
FIG. 1B shows a schematic cross-sectional view of the device architecture according to the present invention, stacking several active- and barrier-layers, with the respective lateral contacts, which are separated by a "Spacer Layer".

FIG. 1a shows a schematic of the device architecture according to the present invention. In FIG. 1b shows the same device architecture accommodating more active- and barrier-layers, with the respective lateral contacts.

In the scientific literature, some opto-electronic processes do not have a single and universal designation. Therefore, for the sake of clarity, it is useful to provide the definitions that will be used throughout the text of the present disclosure:

Inter-Band Transitions

These are transitions that take place between the valence-band and the conduction-band of bulk semiconductors, having each a continuum of energy levels available to the charge carriers. Examples are: a) photo-absorption with generation of electron-hole pairs; b) photo-emission with recombination of electron-hole pairs.

Inter-Subband Transitions

These are transitions that take place between a discrete energy level (subband) the valence-band and a discrete energy level (subband) in the conduction-band. Examples are: a) photo-absorption with generation of electron-hole pairs; b) photo-emission with recombination of electron-hole pairs. The main difference compared to Inter-Band Transitions is that the energy levels available to the electrons and holes are not a continuum, but a set of discrete levels (subbands).

Intra-Subband Transitions

These transitions take place between discrete energy levels (subbands) within the same band—conduction or valence—rather than across the band-gap. For that reason, the band-gap type and magnitude are not relevant, and that makes them very different from the Inter-Band Transitions and Inter-Subband Transitions, for which band-gap type and magnitude are highly relevant.

Materials and Band-Structure in the Vertical Direction

The opto-electronic properties of the films in the epitaxial stack are determined by parameters such as film composition or thickness, for the active- and barrier-layers.

For active-layers thick enough as to not induce quantization of the energy levels in the vertical direction, those films have bulk-like properties, which are set by their chemical (alloy) composition. For barrier-layers thick enough to prevent tunneling, the vertical stack of films will consist of a number of active-layers with bulk-like properties, electrically isolated from each other by insulator films.

Keeping the barrier-layers thick enough to prevent tunneling, but decreasing the thickness of the active-layers, induces quantization of the energy levels allowed to electrons and holes, that is, to the formation of discrete subbands in the conduction- and in the valence-band. In this case, the vertical film stack will consist of a collection of Quantum Wells, having opto-electronic properties strongly dependent on the film thickness of the active-layer, the band-alignment between the active- and the barrier-layer, and the alloy composition of the active-layer itself.

A particular case of QWs is when the active- and barrier-layers each become just a few mono-layers thick, in which case "Short-period Superlattices" are formed, having delocalized or extended energy states, established across several alternating films of the "active-layer" material and of the "barrier-layer" material.

The layer stack structure of the present invention incorporates epitaxial insulators in different positions, performing different roles. In some cases, it will be just to electrically isolate films interacting with photons of different wavelengths, so that they do not become electrically shorted, and in some other cases the insulators are required to make the QWs themselves.

The device architecture concept is independent of any materials system. However, as already mentioned, due to the obvious technical and economic relevance of silicon technology, the examples and embodiments refer to layers compatible with silicon.

Wide Band-Gap Materials Epitaxially Compatible with Silicon

In the scientific literature there is a list of wide band-gap semiconductors and insulators that have been experimentally demonstrated to be epitaxially compatible with silicon. By epitaxially compatible it is meant capable of pseudomorphic deposition, i.e., the deposited films acquire the in-plane lattice constant of silicon, with a lattice distortion along the (vertical) direction of film deposition. As most materials have lattice constants different from that of silicon, the deposited films will be strained. For as long as the film thickness is under the "critical thickness", there will be no strain relaxation and a high degree of crystalline perfection is maintained throughout the film and at the interfaces. The critical thickness does not depend on the material and its lattice mismatch to substrate (silicon) alone, but also on processing parameters such as surface preparation prior to the epitaxial deposition process, as well as the temperature of deposition, method of deposition (MBE, UHV-CVD, RT-CVD, ALD-CVD, etc.), chemistries of precursors, heterojunction profiles, etc. In addition, there are other parameters, such as substrate orientation (for example <100>versus <111>) and strain compensation designs, than can play a decisive role in the successful fabrication of heterojunctions between silicon and wide-band-gap materials.

Some of the better known examples of such materials are: $Al_2O_3$, $ZnS$, $CaF_2$, $CdF_2$, $CeO_2$, $AlN$, $GaN$, $BaTiO_3$, $SrTiO_3$, $Ba_{1-x}Sr_xTiO_3$, etc. This list is growing as research on "Advanced Gate Stacks" aiming at replacing $SiO_2$ as the gate insulator material in MOSFETs, has motivated the study of new materials. Some of these newly researched insulators have indeed been found to be epitaxially (pseudomorphically) compatible with silicon: $Pr_2O_3$, $La_xAl_{2-x}O_3$, $Y_2O_3$, $Ga_2O_3$, etc. Some pseudomorphic insulators on silicon, such as $Pb(Zr_{02}Ti_{08})O_3$ have good piezoelectric properties, and others such as $BaTiO_3$ have good ferroelectric properties. In addition to the well known silicon-based alloys such as $Si_{1-x}Ge_x$ or $Si_{1-x-y}Ge_xC_y$ (or even $Si_{1-x-y-z}Ge_xC_ySn_z$), there are other narrow band-gap materials which can also be pseudomorphically deposited on silicon, such as PbTe.

The band-alignments and band-discontinuities between silicon and some of the materials listed above are not precisely known. It has also to be kept in mind that the band-gap and band-alignment of these materials with silicon may not be the same if they are amorphous or single-crystal films. The reason is that single crystal films are strained, with the possibility of significant changes to the band-structure of the material. Data, some calculated, some measured, is given below about band-gaps and band-alignments (relative to silicon) of a few insulator materials [Most of the data is taken from "Band offsets of wide-band-gap oxides and implications for future electronic devices", John Robertson; J. Vac. Sci. Technol. B 18(3), May/June 2000, pp. 1785–1791]:

$Al_2O_3$ (amorphous or poly-crystalline): $E_G$=8.8 eV, $\Delta E_C$=2.8 eV, $\Delta E_V$=4.9 eV $CaF_2$ (mono-crystalline): $E_G$=12.1 eV, $\Delta E_C$=2.3 eV, $\Delta E_V$=8.7 eV $Y_2O_3$ (amorphous or poly-crystalline) $E_G$=6 eV, $\Delta E_C$=2.3 eV, $\Delta E_V$=2.7 eV $CdF_2$ (mono-crystalline): $E_G$=8 eV, $\Delta E_C$=−0.6 eV, $\Delta E_V$=7.5 eV $SrTiO_3$ (mono-crystalline): $E_G$=−3.3 eV, $\Delta E_C$≅0.1 eV, $\Delta E_V$≅2.1 eV As reference, the band alignments for the two most used insulators on silicon are given below:

$SiO_2$ (amorphous) $E_G$=9 eV, $\Delta E_C$=3.5 eV, $\Delta E_V$=4.4 eV $Si_3N_4$ (amorphous or poly-crystalline) $E_G$=5.3 eV, $\Delta E_C$=2.4 eV, $\Delta E_V$=1.8 eV As the data above shows, the band offsets between metal oxides and silicon can vary dramatically, especially for the conduction band. For example, see the difference between: $E_C(Al_2O_3)-E_C(Si)$=2.8 eV and $E_C(CdF_2)-E_C(Si)$=−0.6 eV. $CdF_2$ on Silicon is an extreme case, since it is a wide band-band-gap insulator, it provides a very large barrier for holes but for electrons it is a "potential well" rather than a "potential barrier".

The band diagrams shown in the Figures throughout the present invention are based on the band alignments given above between the depicted materials and silicon.

For structures involving Si and materials with very large band offsets such as $Al_2O_3$, the QWs have very large barrier, and are well modeled by the "infinitely deep well" approximation. Very large potential barriers are highly desirable for designing devices where the "ground state" and the "excited state" in the active-layers, are both bound states, that is, are both significantly distant from the band-edge (conduction or valence) of the barrier-layers.

The very large band offsets enable the interaction with photons with much larger energies (shorter wavelengths) than what is possible with the III/V materials system. This is particularly critical for Intra-Subband Transitions. The band offset between Si and $Al_2O_3$, for example, is much larger than the typical band offsets possible with III/V materials such as GaAs/AlGaAs, InP, or even AlN/AlGaN. This is especially true for the offsets between the valence-bands of Si and $CaF_2$ ($\Delta E_V$=8.7 eV). But even $Al_2O_3$ ($\Delta E_V$=4.9 eV) provides sufficiently large barriers for photons in the visible spectrum, with energies ranging from $h\upsilon$≈1.8 eV ($\lambda$=700 nm), to $h\upsilon$≈3.1 eV ($\lambda$=400 nm), or even higher energies for the UV spectrun. None of the III/V materials mentioned above have band offsets large enough to allow Intra-Subband Transitions for photons with these energies.

For insulator films thick enough to prevent tunneling between QWs (decoupled QWs) having such large conduction- and valence-band offsets, it is not possible to establish, at room temperature a current flow perpendicular to the QWs. Thus materials with very large band offsets are more suitable for device architectures with charge carrier transport parallel to the QWs.

Charge carrier transport perpendicular to the QWs is possible if the insulator films are thin enough for large tunneling currents. Therefore superlattice devices with vertical charge carrier transport are possible with epitaxial layers of silicon and metal oxides. Opto-electronic devices making use of superlattices of silicon and wider band-gap materials have been proposed in prior art ["Quantum Parallel Laser: A Unipolar Superlattice Interminiband Laser"; L. Friedman, R. A. Soref, and G. Sun; IEEE Photonics Technology Letters, Vol. 9, No. 5, May 1997, pp. 593–595]. However, possibly because of fabrication-related problems these have never been experimentally demonstrated.

Devices with Amorphous or Poly Active-Layers

As already mentioned herein, the concept of the invention can be implemented in any materials system. The examples given have used silicon-compatible materials, due to the obvious economic interest in implementing the device in that system.

The examples given always required epitaxial pseudo-morphic growth to insure high crystalline quality of all the active-layers in the device. Naturally, such layers offer the highest performance in terms of defect density, recombination rates, charge carrier mobility, etc.

However, pseudomorphic growth of such heterojunctions demands accurate control of the processing conditions and requires high quality substrates, that is single crystal silicon wafers.

Low cost, "large area" substrates and processing, are only possible with amorphous or poly-crystalline films and therefore some modifications are needed to the structures defined for the single-crystal version of the device. Since the band-gap engineering with silicon alloys, requires strained layers, it becomes impossible to simple copy the layer sequence and obtain the same band alignments with the amorphous/poly version of the films.

Some types of band alignments and/or some ranges of band offsets won't easy if possible at all, with the same kinds of silicon-based alloys. Other materials, or fewer degrees of freedom in the design the structures would have to be accepted.

Band-Alignment and Work-Function Engineering of Lateral Contacts

The present invention departs in a fundamental way from prior art such as the OWIP [See for example "Intersubband Transitions in Quantum Wells: Physics and Device Applications I", H. C. Liu, and F. Capasso, Semiconductors and Semimetals, Vol 62, November 1999, Academic Press], the QCL [see for example "Intersubband Transitions in Quantum Wells: Physics and Device Applications II", H. C. Liu, and F. Capasso, Semiconductors and Semimetals, Vol 66, November 2000, Academic Press], and the OPL ["Quantum Parallel Laser: A Unipolar Superlattice Interminiband Laser"; L. Friedman, R. A. Soref, and G. Sun; IEEE Photonics Technology Letters, Vol. 9, No. 5, May 1997, pp. 593–595], in the engineering of the band-alignment and work-function of the lateral contacts. QWIP and QCL do not have any lateral contacts at all. QPL suggests lateral contacts, but they are not specified, and there is omission on how transport is supposed to take place, as there are no band-diagrams or text explanation of the working principles of those contacts. This point is extremely important, as will be seen in the following paragraphs.

The engineering of the lateral contacts shown in FIGS. 1A and 1B depend on the energy of the photons to be interacted with, and on the type of transitions taking place in the activelayers. Each contact consists of an insulator layer and conductor layer. For that reason, the exact insulator materials and their band-alignments, the conductor materials and their workfunctions, are different depending if the transitions take place only in the conduction-band, only in the valence-band, or across the band-gap, depending on the types of transitions. Such differences can be seen in the band-diagrams of FIGS. 3, 4, 5.

For the present invention the choice of materials for the lateral contacts depends on the band-edge and work-function alignments required by the device operation. Different materials will be required depending on the energy levels in the active-layers, which carriers are supposed to be injected or extracted.

For active-layers with bulk-type band-structure (FIGS. 2C, 2D), the energy levels can be the same as the conduction- and valence-band edges of the bulk material of which the active-layer is comprised.

"For QWs, charge carriers will be required to be injected into and extracted from subbands in the active-layers that may be energetically distant from the conduction- and/or valence-band edges of the bulk material that the active-layer is made of. Because the energy difference between the "excited subband" and the "ground subband" is dependent on the energy of the photons to be absorbed or emitted, this issue is important for Inter-Subband Transitions (i.e., Quantized Interband Transitions) (FIGS. 3B, 3C, 3D), and it is even important so for Intra-Subband Transitions in the conduction-band (i.e., Electron Intersubband Transitions) (FIGS. 4B, 4C, 4D), or in the valence-band (i.e. Hole Intersubband Transitions) (FIGS. 5B, 5C, 5D)."

In order to estimate how far from the band-edges the "excited subband" may be, it is enough to see that for infrared wavelengths, such as $\lambda$=1550 nm, the photon energy is 0.8 eV, and that for the visible range the energy of the photon can be up to more than 3 eV. Therefore materials to contact the "excited subband" of Intra-Subband Transitions for the higher energy photons of the visible spectrum may be somewhat difficult to fabricate.

Therefore, even though from a conceptual and functional point of view, the lateral contacts in a wavelength-selective device according to the invention are intrinsic to the device architecture, the exact materials implementing those contacts depend on the precise energy levels in the active-layers between which the opto-electronic transitions will take place. The choice of those energy levels is essentially determined by the range of wavelengths for photon absorption or emission, and by the type of opto-electronic transition: Inter-Band, Inter-Subband or IntraSubband.

For the reasons outlined above, the contacts are completely different from conventional contacts to electronic or opto-electronic devices. The active-layers of the device may be undoped, and insulator films are intentionally interposed between the active-layers and the conductor materials, which can be metals or highly doped semiconductors. The insulator and conductor materials are chosen according to the energy levels to be contacted. For this reason, there must be a separate fabrication of a lateral contact for charge carrier injection and a lateral contact for charge carrier extraction. This enables selectivity in two ways:
a) Electron transport or hole transport, but not both, at the same contact;
b) Particular energy level (subband) into which electrons or holes are injected, or out of which are extracted from.

These effects are shown in the band-diagrams describing the operating principles of the device (FIGS. 3, 4, 5), and are the basis for the change in mode of operation, i.e., changing the voltage at the lateral contacts, which enable different functionalities and applications for the same device.

The interposition of thin insulator films between the active-layers and the conducting materials is also beneficial from a fabrication standpoint. The presence of thin insulator films, providing good interfacial properties with silicon, such as low density of interface states, is highly beneficial as it prevents interfacial reactions between silicon and the adjacent conducting materials. Typically, when metals come into contact with a clean silicon surface, a metal-silicide compound is formed, which has a work-function near the middle of the band-gap of silicon.

As will be discussed later, and as shown in FIGS. 3, 4, 5, the charge carrier transport through the thin insulator films in some cases will be by tunneling and in others it will be by band-edge transport. The reasons for one or the other transport mechanisms are related to the type and energy of the opto-electronic transition and the work-function of the conductors in the contacts.

Tunneling Transport Through Lateral Contacts

Tunneling through ultra-thin films of insulators, such as $SiO_2$ or $SiO_{2-x}N_x$, is the transport mechanism for some MOS-based Non-Volatile Memories. At present, MetalInsulator-Semiconductor (MIS or MOS) systems with ultra-thin insulator layers are a very important topic of research in solid-state electronics, namely for advanced CMOS for the 0.1 $\mu$m generation and below. The reason is that standard CMOS scaling requires the thinning of the gate insulator ($SiO_2$) for each new technology generation. Gate lengths of 0.1 $\mu$m and smaller, and/or operating voltages of 1 Volt and below, require the $SiO_2$ thickness to be less than 2.5 nm. At this point, "direct" or "ballistic" tunneling, rather than Fowler-Nordheim tunneling, is the mechanism responsible for transport across the insulator. Very large current densities are then inevitable, because in this thickness regime, current density is exponentially dependent on the insulator thickness. Research has experimentally verified that extremely thin-films of insulators such as $SiO_2$ and $Si_3N_4$, have a much higher breakdown field than the "bulk-like" values of thicker films, and that in fact, it is even difficult to define the breakdown point. These ultra-thin films are then capable of enduring extremely large tunneling current densities, apparently without detectable damage, perhaps because "ballistic tunneling" implies the absence of scattering within the insulator film and hence a lower probability of damage.

The present invention takes advantage of the knowledge generated by this previous research, but for the opposite purpose of the initial motivation it in the first place: use of very-thin insulator layers to enable high tunneling currents. The insulator films act as physio-chemical barriers and provide a means for the band-alignment and work-function engineering between silicon active layers and metals.

The materials for the lateral contacts may be optimized according to several parameters, such as the energy of the photons, the type of opto-electronic transitions, and the functionality of the devices, i.e., photon-detection, suppression of photon-absorption, photon-emission.

Band-Edge Transport Through Lateral Contacts

In conventional devices, charge carrier transport takes place near the band-edges. Most insulators have band-alignments with silicon such that there are fairly large potential barriers for electrons and for holes. There are very few special cases where the alignment is very asymmetric, that is, the barrier height for one type of charge carrier is much smaller than for the other kind, as already mentioned above, for the extreme case of $CdF_2$.

In wavelength-selective photonic devices according to the invention, some energy levels (subbands) are positioned far away from the bulk band-edge values. For these devices, the energy levels, which are set by the properties of the layer stack in the vertical direction, are positioned above the conduction-edge, or below the valence-band edge of the lateral contact insulator. In this case, the insulators present no potential barriers for charge carriers residing in those subbands, thus no tunneling is required to go from one side to the other of the insulator film(s).

When the conductor material has a work-function value very closely aligned with the band-edge of the insulator, a small applied voltage between the lateral contacts is enough for efficient transport to occur at a contact with such band-edge and work-function alignments.

Band-edge transport across the very short distance presented by the insulator film thickness is likely to be "ballistic" in nature. It follows also that there is minimal if any potential drop over the thin film for this kind of transport. Therefore, when voltage is applied between the lateral contacts, an immediate and very fast transient current flows into or out of the active-layers.

Principles of Operation of the Wavelength-Selective Photonic Process

Figure 2A:
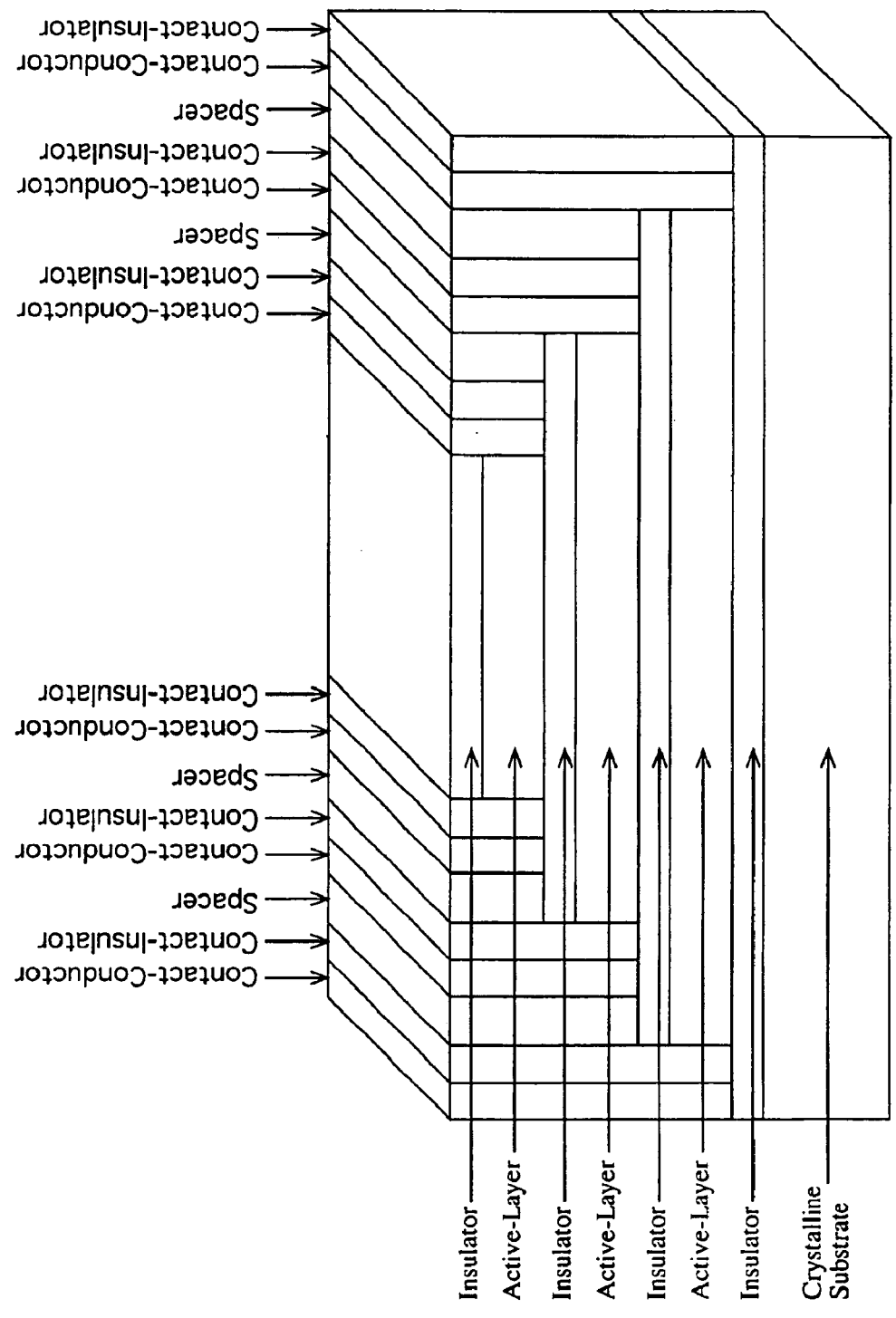
FIG. 2A shows an exemplary implementation of the present invention for operation through Inter-Band Transitions. This figure depicts multiple active- and barrier-layers stacked with decreasing band-gap from the top, where light penetrates the stack, to the bottom facing the substrate.
Figure 2B:
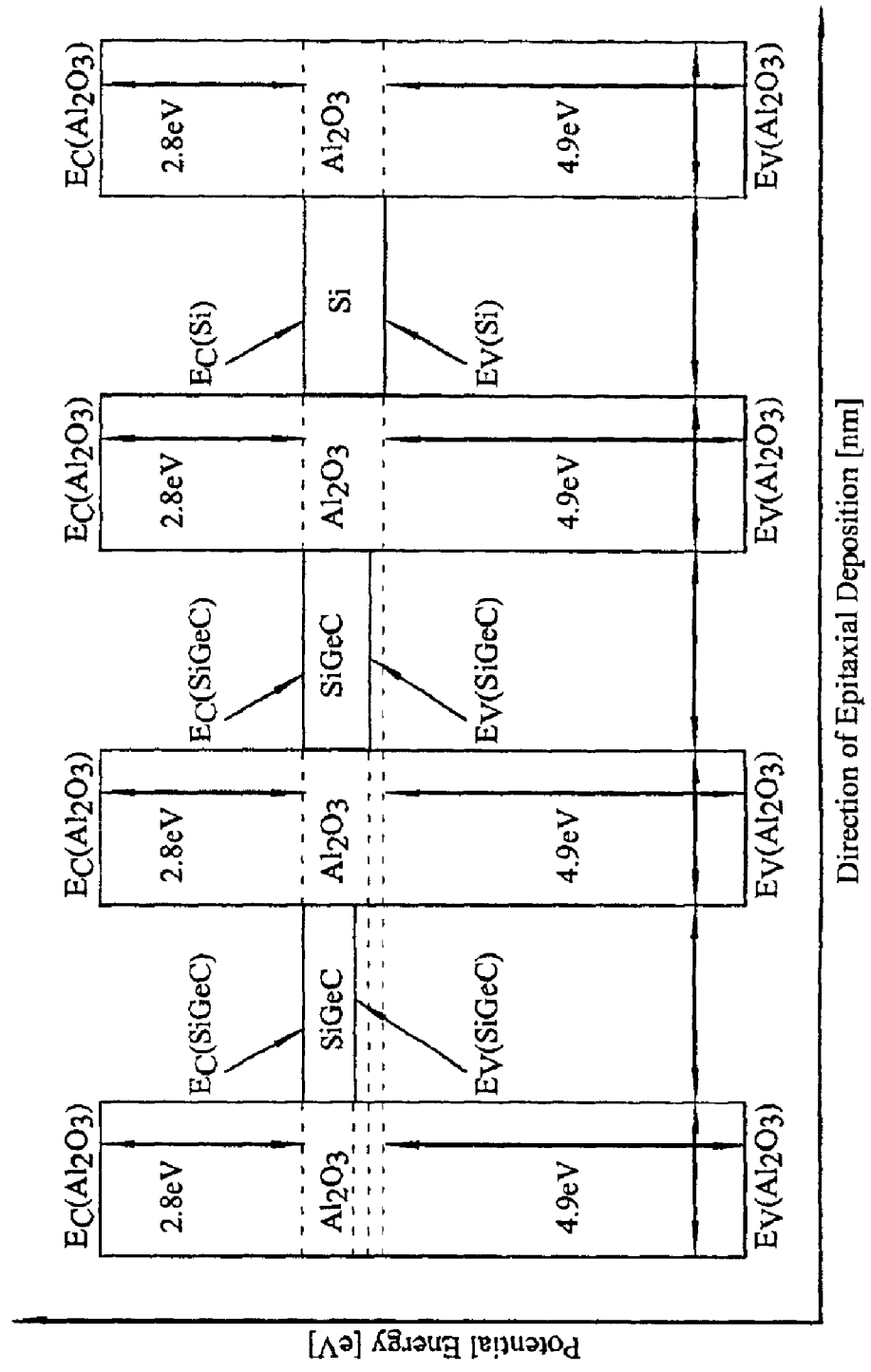
FIG. 2B shows the band-diagram along a cross-sectional cut in the direction of epitaxial deposition (vertical direction).
Figure 2C:
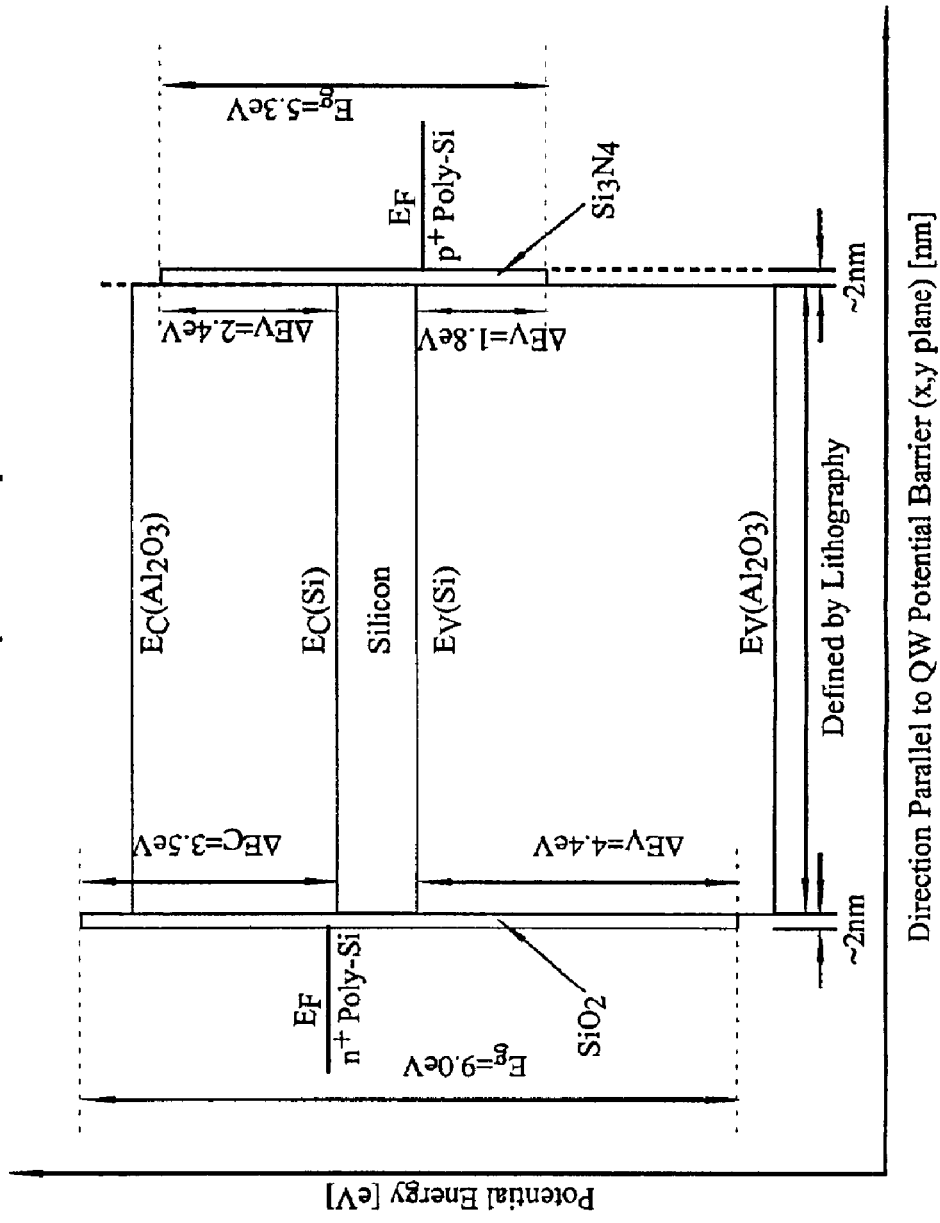
FIG. 2C shows the band-diagram for one of the active-layers, in "flat-band" bias condition, along a cross-sectional cut in the direction between the two lateral contacts (horizontal direction).
Figure 2D:
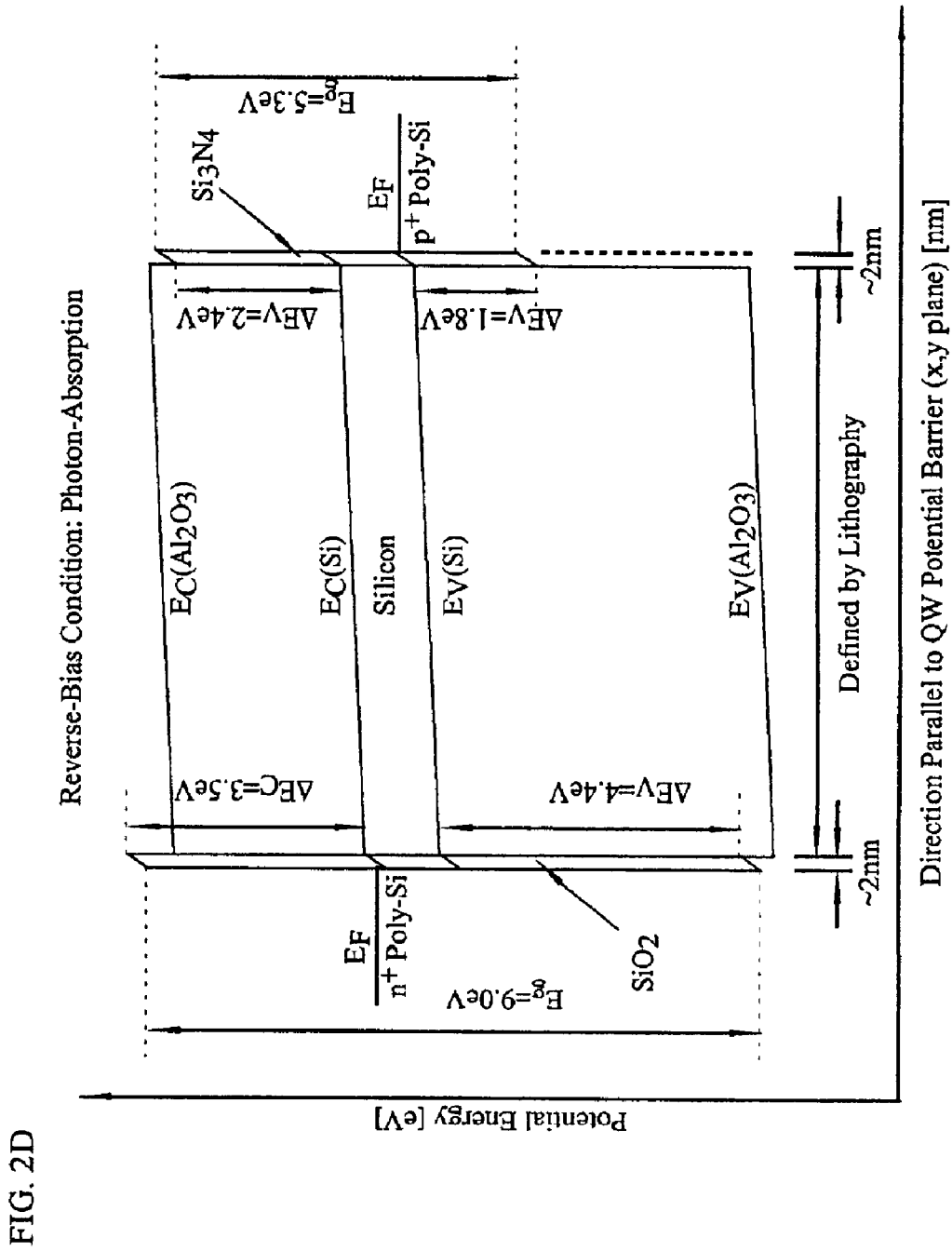
FIG. 2D shows the band-diagram for one of the active-layers, in reverse bias condition, suitable for photo-detection, along a cross-sectional cut in the direction between the two lateral contacts (horizontal direction).

FIG. 2A shows an exemplary implementation of the present invention for operation through Inter-Band Transitions, with a stack of multiple active-layers for different wavelengths. The different active-layers are made of Si, or SiGe, or SiGeC, or SiGeCSn random alloys and/or superlattices, with varying composition and/or profiles. In this example, the material used for the barrier-layer is $Al_2O_3$. FIG. 2B shows the band-diagram of a cross-sectional cut along the (vertical) direction of epitaxial deposition. FIG. 2C shows the band-diagram for one of the active-layers, in a reverse bias condition suitable for photo-detection, of a cross-sectional cut along the (horizontal) direction between the two contacts.

With this particular embodiment, the active-layer has bulk-like opto-electronic properties. Hence, if the bulk material has an indirect band-gap, then the active-layer will be inefficient for light-emission purposes, as is the case with the bulk material.

Since Inter-Band Transitions act as low-pass filters, different wavelengths can be absorbed in different active-layers with different band-gaps, provided that the active-layers are monotonically ordered from wider to narrower band-gap, from the top, where light penetrates the film stack, to the bottom, the substrate where the film stack is formed.

Modification of the band-gap of the active-layers can be done by changing the alloy composition and profiles of the active-layers.

FIGS. 3A–3D show the band-diagrams of an exemplary implementation of the present invention for operation through Inter-Subband Transitions, using an undoped silicon active-layer. In this example, the material for the barrier-layer is $Al_2O_3$. The Figures show a particularly relevant case of Inter-Subband Transition for silicon active-layers, because the subband in the conduction-band is more than 3.4 eV above the valence-band edge, and therefore positioned in the $\Gamma_1$ band. This band ($\Gamma_1$) is located at the center of the Brillouin zone of silicon and therefore provides a direct band-gap. It is well known that the smallest band gap of silicon is at $E_G$=1.12 eV, but it is also known that silicon has direct band-gaps at $E_{\Gamma 1}$=3.4 eV and $E_{\Gamma 2}$=4.2 eV. However, in energetic terms, they are very far away from the minimum band-gap, which is indirect.

Being so energetically distant from the conduction-band edge, makes it impossible to populate or depopulate these energy bands, and hence to design devices to specifically make use and take advantage of these direct band-gaps. It is easy to confirm this, by the lack of silicon LEDs or Lasers emitting photons at either of these energies, and by the lack of silicon photo-detectors selectively absorbing photons of these energies and higher, while not absorbing photons with less energy (longer wavelengths).

A Wavelength-Selective Photonic device according to the invention can be designed to specifically make use and take advantage of such high-lying energetic bands. Through the quantization induced by the epitaxial stack in the vertical direction, it is possible to position the lowest energy level (subband) in the conduction-band to be above the bottom of the $E_{\Gamma 1}$ valley, or of the $E_{\Gamma 2}$ valley. The engineering of the lateral contact used to inject electrons into the active-layers, is such that the conductive material (metal or highly doped semiconductor) has its work-function as close as possible to the subband into which the electrons will be injected. This requires a very small work-function, which might not be easily achieved with metals, but that could be implemented with n-type doped semiconductors, a few of which, such as AlN, even have a Negative Electron Affinity (NEA). The insulator at this lateral contact, ideally has its conduction-band edge above the subband of the active-layer, and at the same time below the work-function mentioned above.

The energy of the direct band-gaps can be changed by making the active-layers of the QWs with $Si_{1-x-y-z}Ge_xC_ySn_z$ (SiGeCSn) random alloys and/or superlattices. At the present it is not known how the incorporation of Sn to make SiGeCSn random alloys and/or superlattices, modifies the band-structure and the band-alignments with respect to silicon. It is also well known that for SiGe layers strained to silicon with very high Ge content, the band-structure of those layers becomes Ge-like. It is also well known that, similarly to Si, the smallest band-gap of Ge is indirect at $E_G$=0.66 eV, but it is also known that Ge has direct band-gaps at $E_{\Gamma 1}$=0.8 eV and $E_{\Gamma 2}$=3.22 eV. The incorporation of carbon, to make SiGeC strained layers, can have two effects: the addition of carbon can, partially or fully, compensate the strain induced by germanium, and carbon may itself induce a reduction of the band-gap, through lowering the conduction-band with respect to silicon. These factors enable the engineering of the magnitude of the direct band-gaps of active-layers made with SiGeC, rather than pure Si, so that different wavelength ranges can be targeted with Inter-Subband opto-electronic transitions.

Figure 3A:
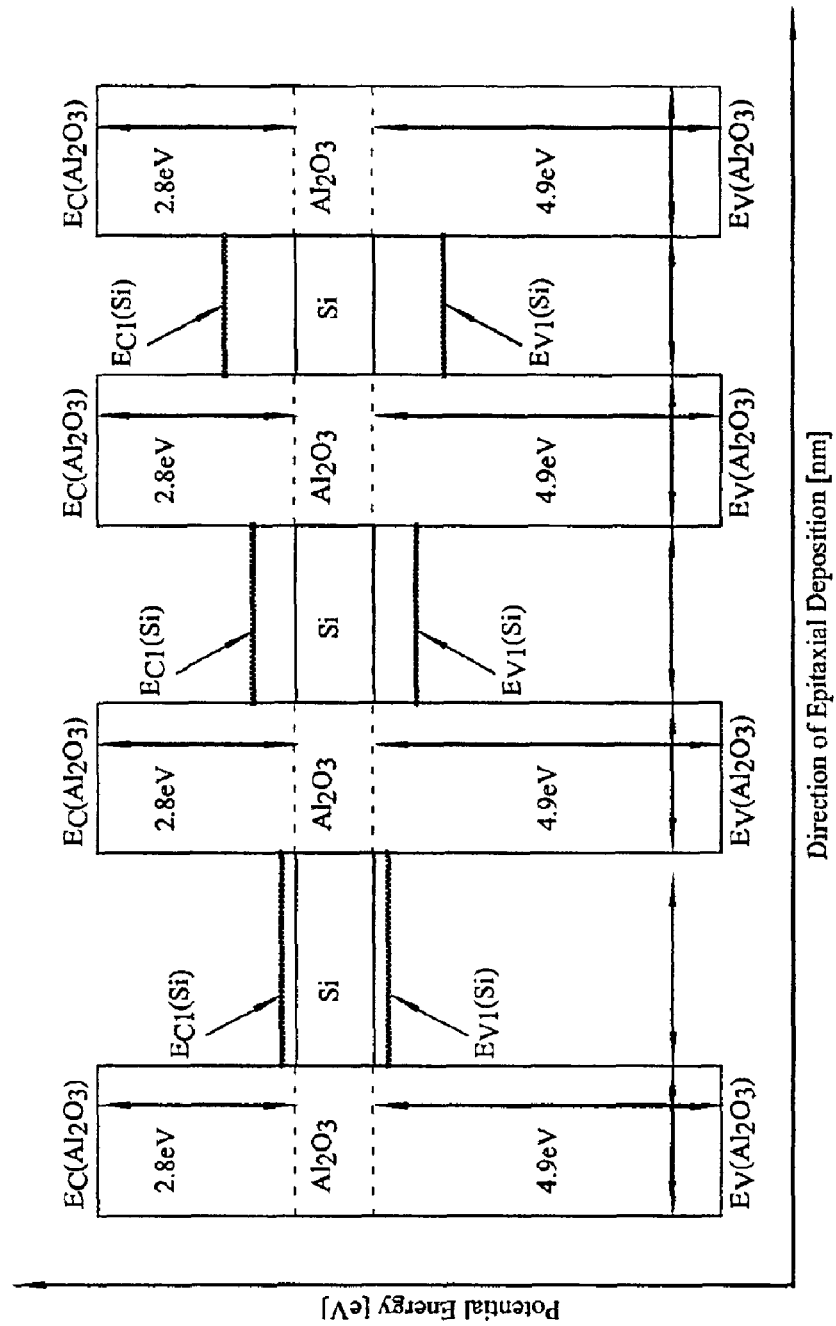
FIGS. 3A–3D, show the band-diagrams of an exemplary implementation of the present invention for operation through Inter-Subband Transitions.

FIG. 3A shows the band-diagram of a cross-sectional cut along the (vertical) direction of epitaxial deposition.

Figure 3B:
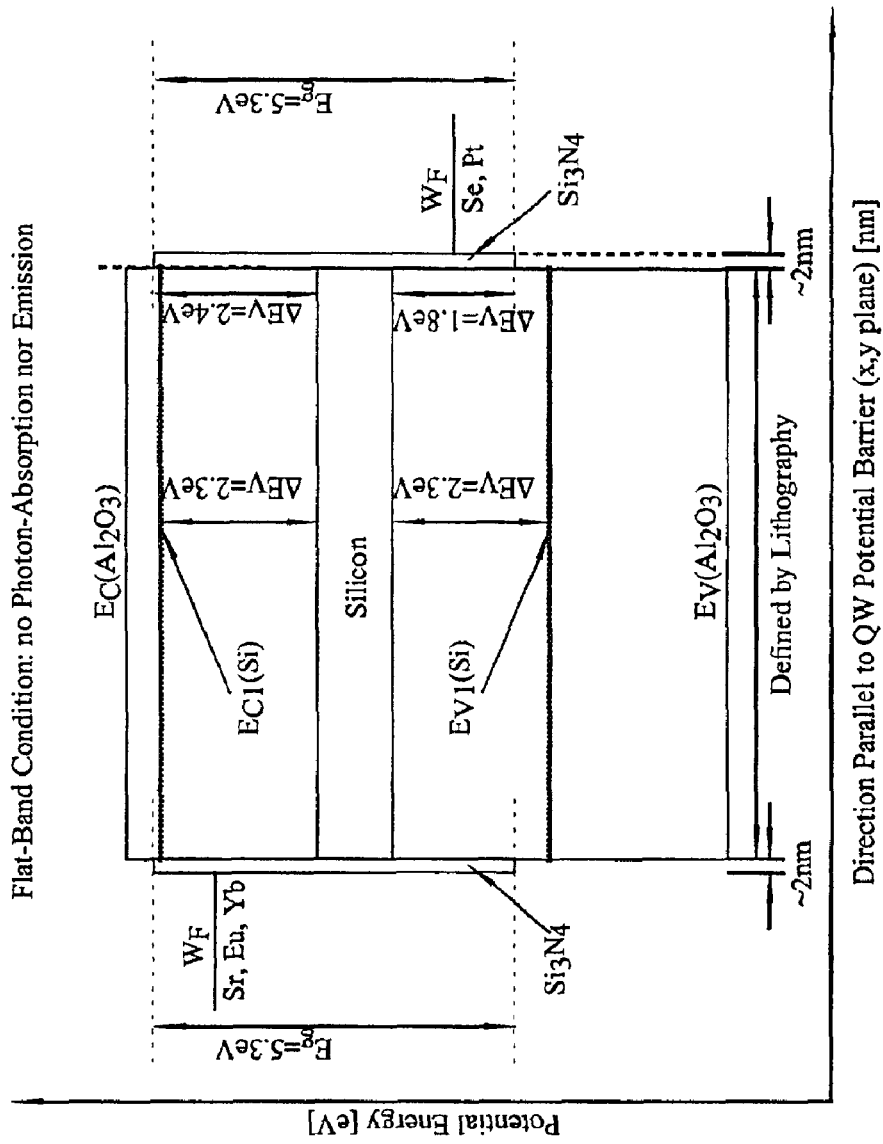

FIG. 3B shows the band-diagram for one of the active-layers, of a cross-sectional cut along the (horizontal) direction between the two contacts. The depicted reverse bias condition is suitable for Wavelength-Selective photon-absorption, under which the device is opaque to selected wavelengths, while transparent to all others.

Figure 3C:
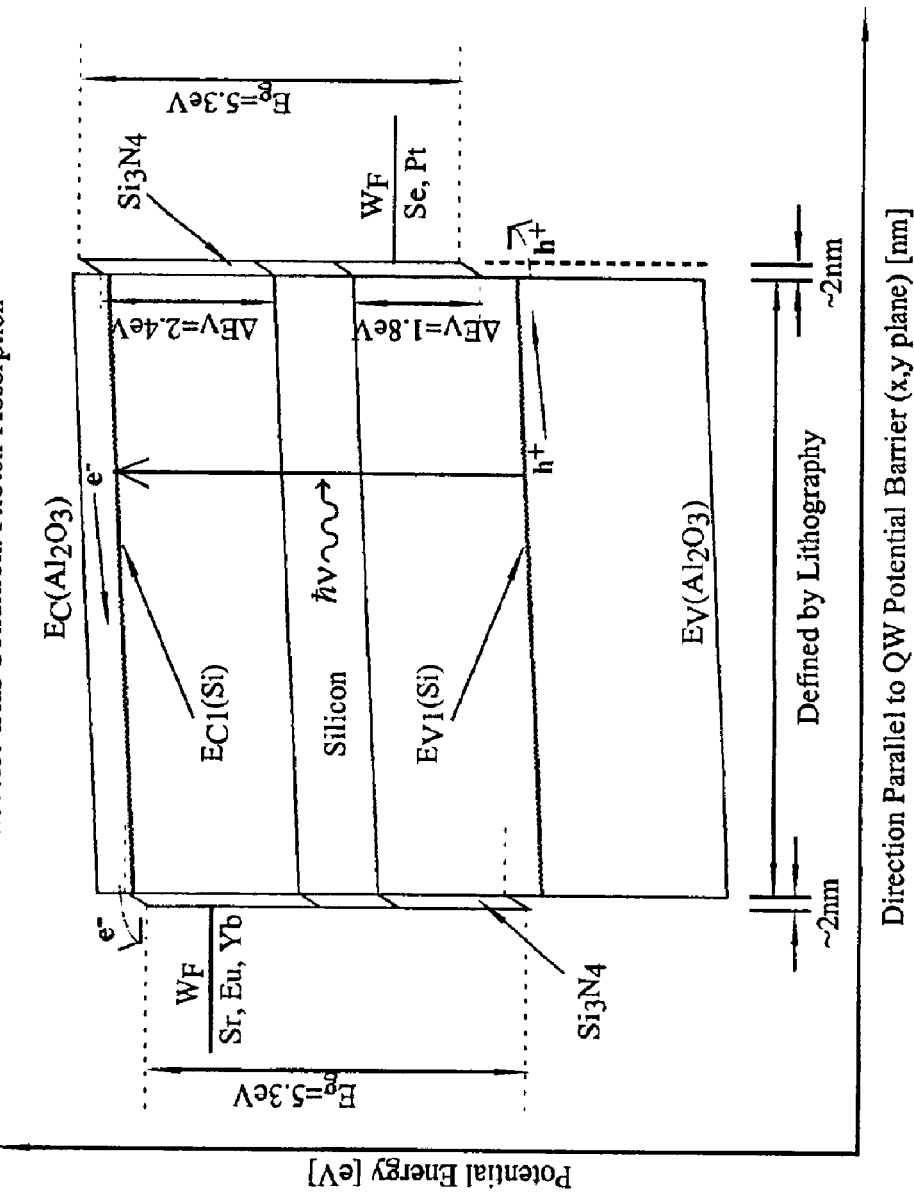

FIG. 3C shows the band-diagram for one of the active-layers, of a cross-sectional cut along the (horizontal) direction between the two contacts. The depicted forward bias condition is suitable for Wavelength-Selective photon-emission, under which the device is transparent to all other wavelengths.

Figure 3D:
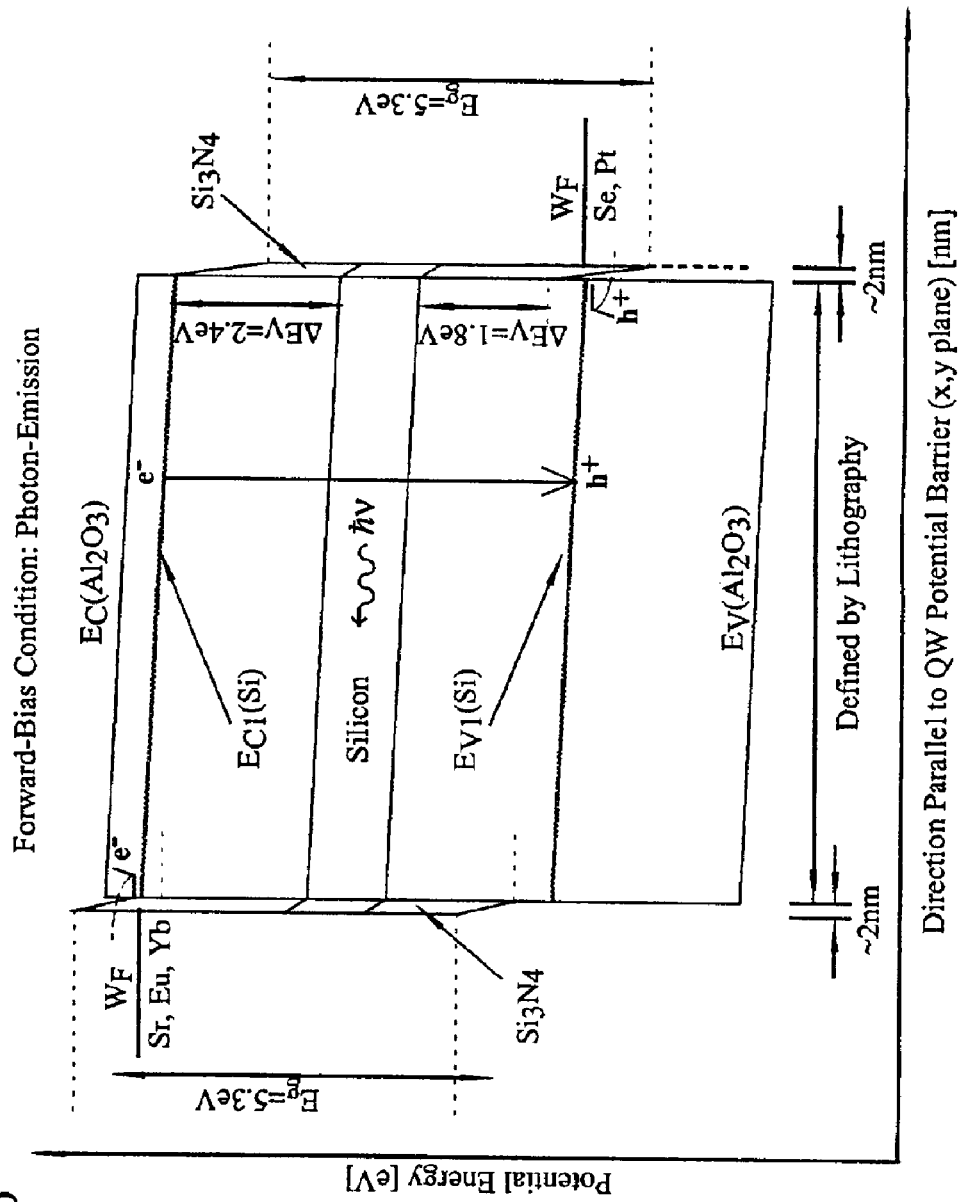

FIG. 3D shows the band-diagram for one of the active-layers, of a cross-sectional cut along the (horizontal) direction between the two contacts. The depicted flat-band bias condition is suitable for neither photon-absorption nor photon-emission, under which the device is transparent to all wavelengths.

FIGS. 4A–4D show an exemplary implementation of the present invention for operation through Intra-Subband Transitions in the conduction-band, using an undoped silicon active-layer. In this example, the material for the barrier-layer is $Al_2O_3$. The energy subbands depicted in these Figures were calculated for QWs made on <111> oriented silicon wafer substrates.

In this exemplary implementation, the energy of the photons to be absorbed and/or emitted is significantly smaller than the indirect band-gap of silicon. Two ranges of wavelengths in that category are λ=1310 nm and λ=1550 nm, which are used for fiber optic communications. It should be recognized that for λ=1550 nm the higher energy subband ("excited state") is about 1 eV above the conduction-band edge of bulk silicon.

It should also be noted that <100> is the axis of symmetry in the k-space for silicon. For this reason, for Intra-Subband Transitions, it is not possible to couple electromagnetic radiation perpendicular to the <100> in real space. However, according to prior art ["Calculation of the intersubband absorption strength in ellipsoidal-valley quantum wells" E. R. Brown, and S. J. Eglash, Phys. Rev. B, Vol. 41, Number 11, 15 April 1990-I, pp. 7559–7568] by forming the QWs on <111> oriented silicon surfaces, it is possible to couple the electromagnetic radiation perpendicular to those surfaces, that is, to <111> surfaces. Conversely, for a Ge-like band-structure, having k-space symmetry along the <111> orientation, <100> is the preferred crystal orientation for coupling light perpendicularly to the substrate surface.

Figure 4A:
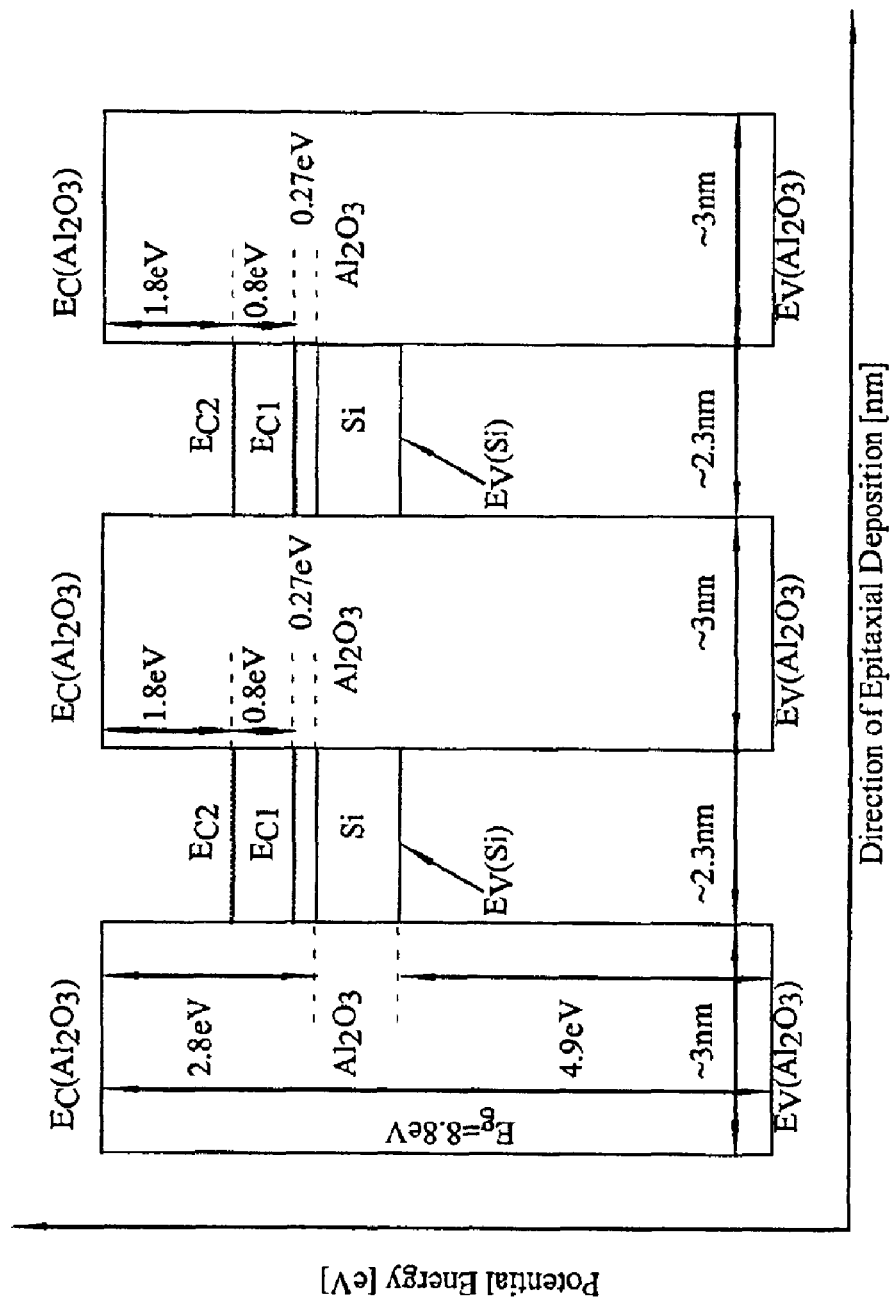
FIGS. 4A–4D, show an exemplary implementation of the present invention for operation through Intra-Subband Transitions in the conduction-band.

FIG. 4A shows the band-diagram of a cross-sectional cut along the (vertical) direction of epitaxial deposition.

Figure 4B:
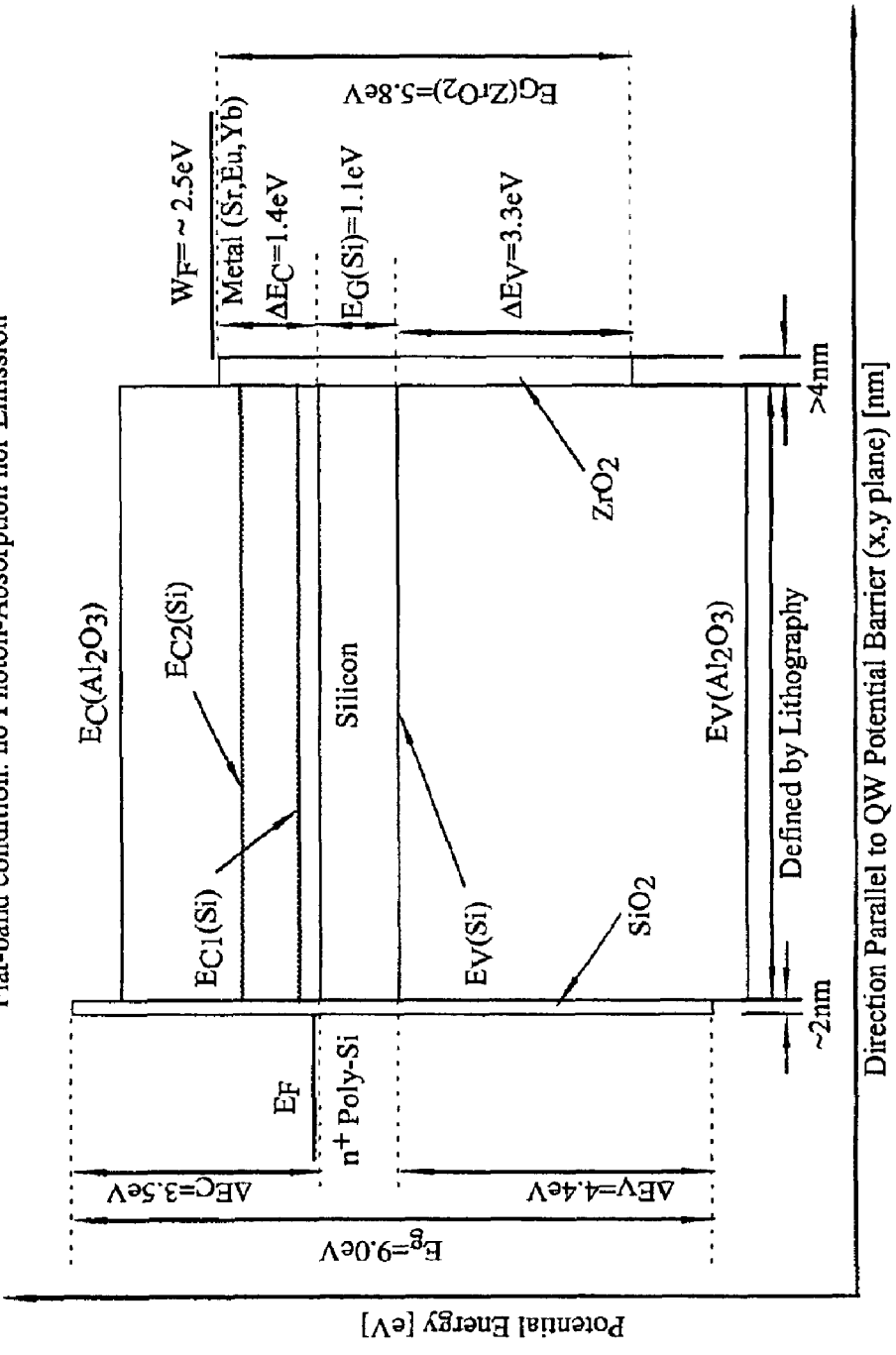

FIG. 4B shows the band-diagram for one of the active-layers, of a cross-sectional cut along the (horizontal) direction between the two contacts. The depicted reverse bias condition is suitable for Wavelength-Selective photon-absorption, in which the device is opaque to selected wavelengths, while transparent to all others.

Figure 4C:
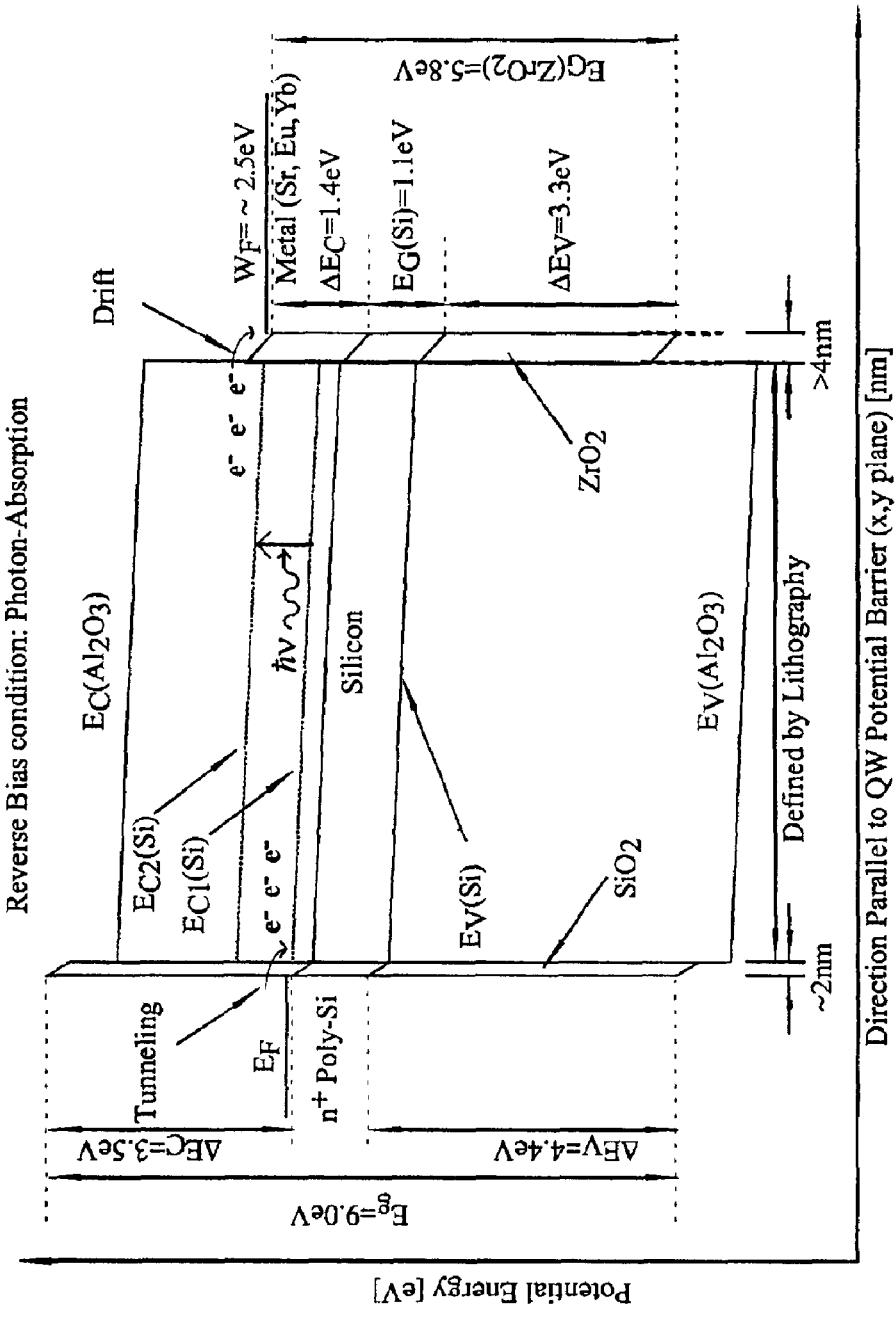

FIG. 4C shows the band-diagram for one of the active-layers, of a cross-sectional cut along the (horizontal) direction between the two contacts. The depicted forward bias condition is suitable for Wavelength-Selective photon-emission, in which the device is transparent to all other wavelengths.

Figure 4D:
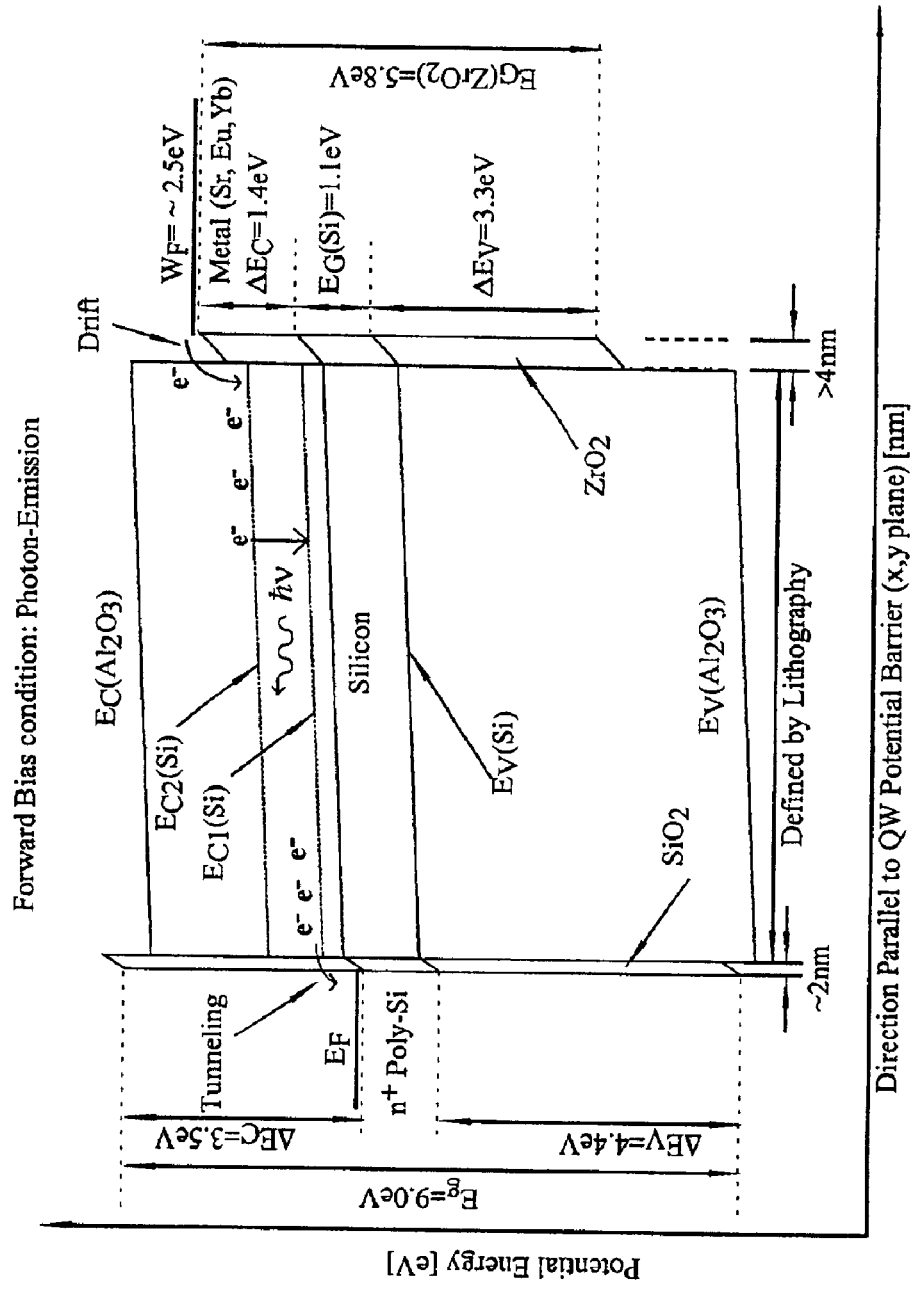

FIG. 4D shows the band-diagram for one of the active-layers, of a cross-sectional cut along the (horizontal) direction between the two contacts. The depicted flat-band bias condition is suitable for neither photon-absorption nor photon-emission, in which the device is transparent to all wavelengths.

FIGS. 5A–5D show an exemplary implementation of the present invention for operation through Intra-Subband Transitions in the valence-band, using an undoped SiGeC active-layer. In this example, the material for the barrier-layer is $Al_2O_3$.

Figure 5A:
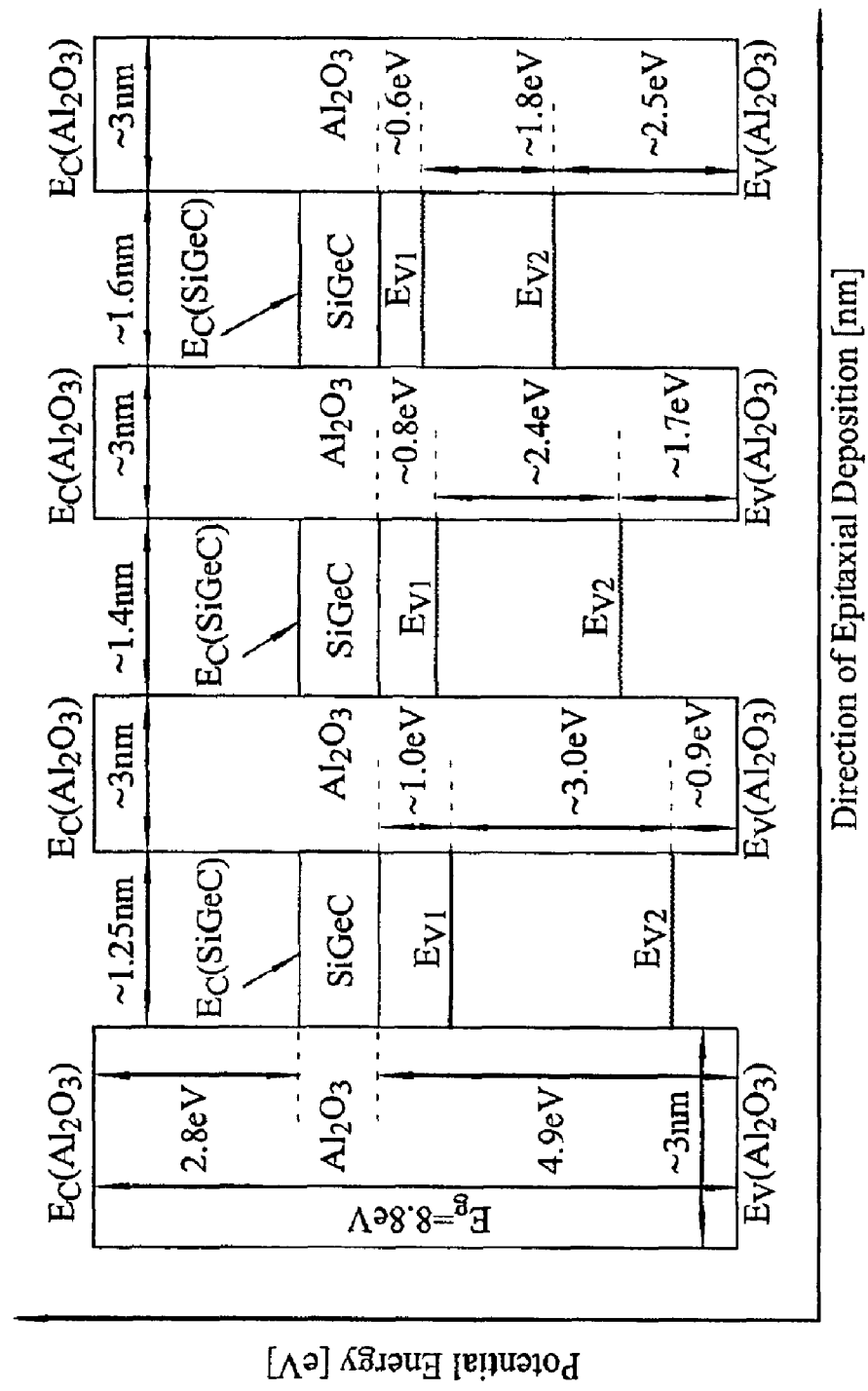
FIGS. 5A–5D, show an exemplary implementation of the present invention for operation through Intra-Subband Transitions in the valence-band.

FIG. 5A shows the band-diagram of a cross-sectional cut along the (vertical) direction of epitaxial deposition.

Figure 5B:
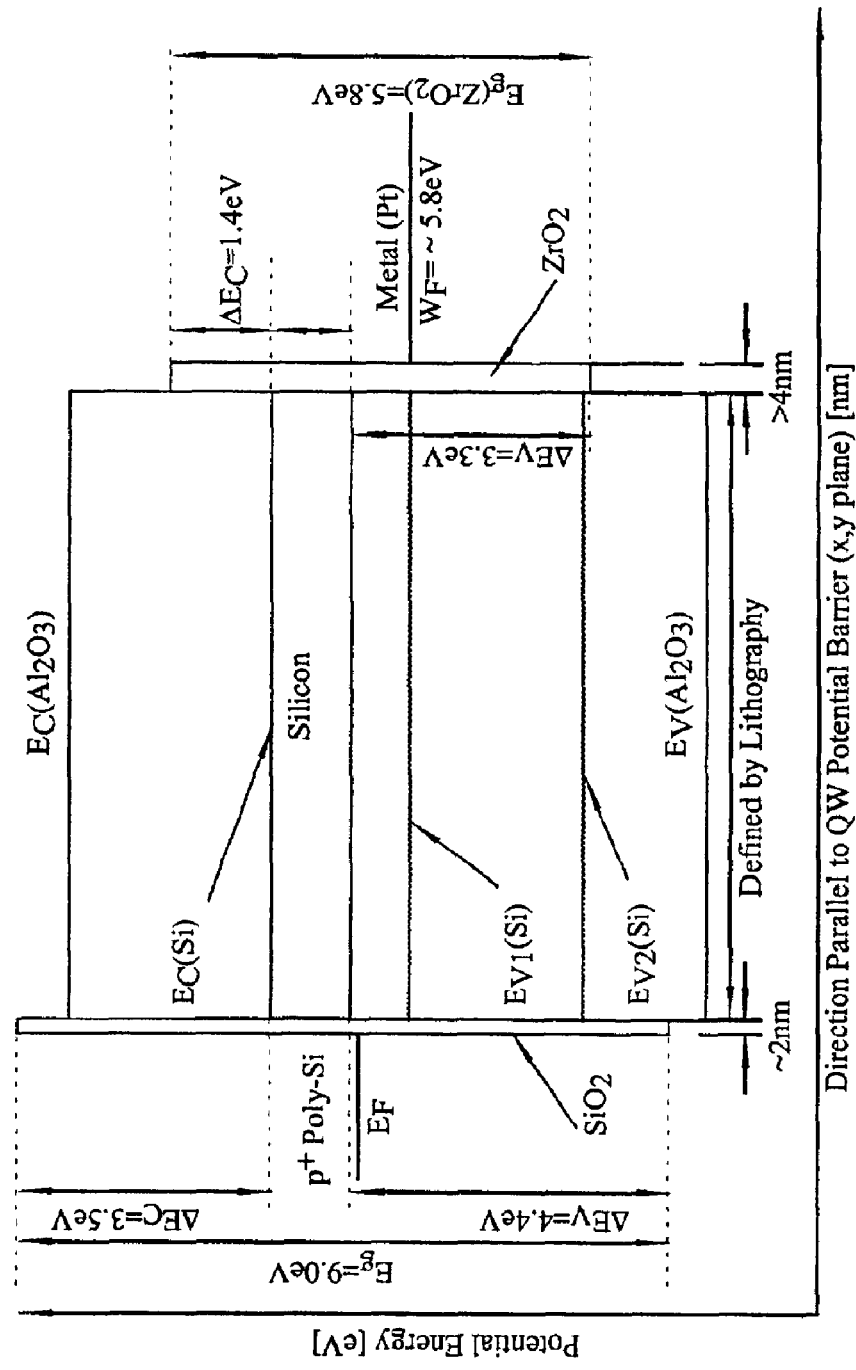

FIG. 5B shows the band-diagram for one of the active-layers, of a cross-sectional cut along the (horizontal) direction between the two contacts. The depicted reverse bias condition is suitable for Wavelength-Selective photon-absorption, in which the device is opaque to selected wavelengths, while transparent to all others.

Figure 5C:
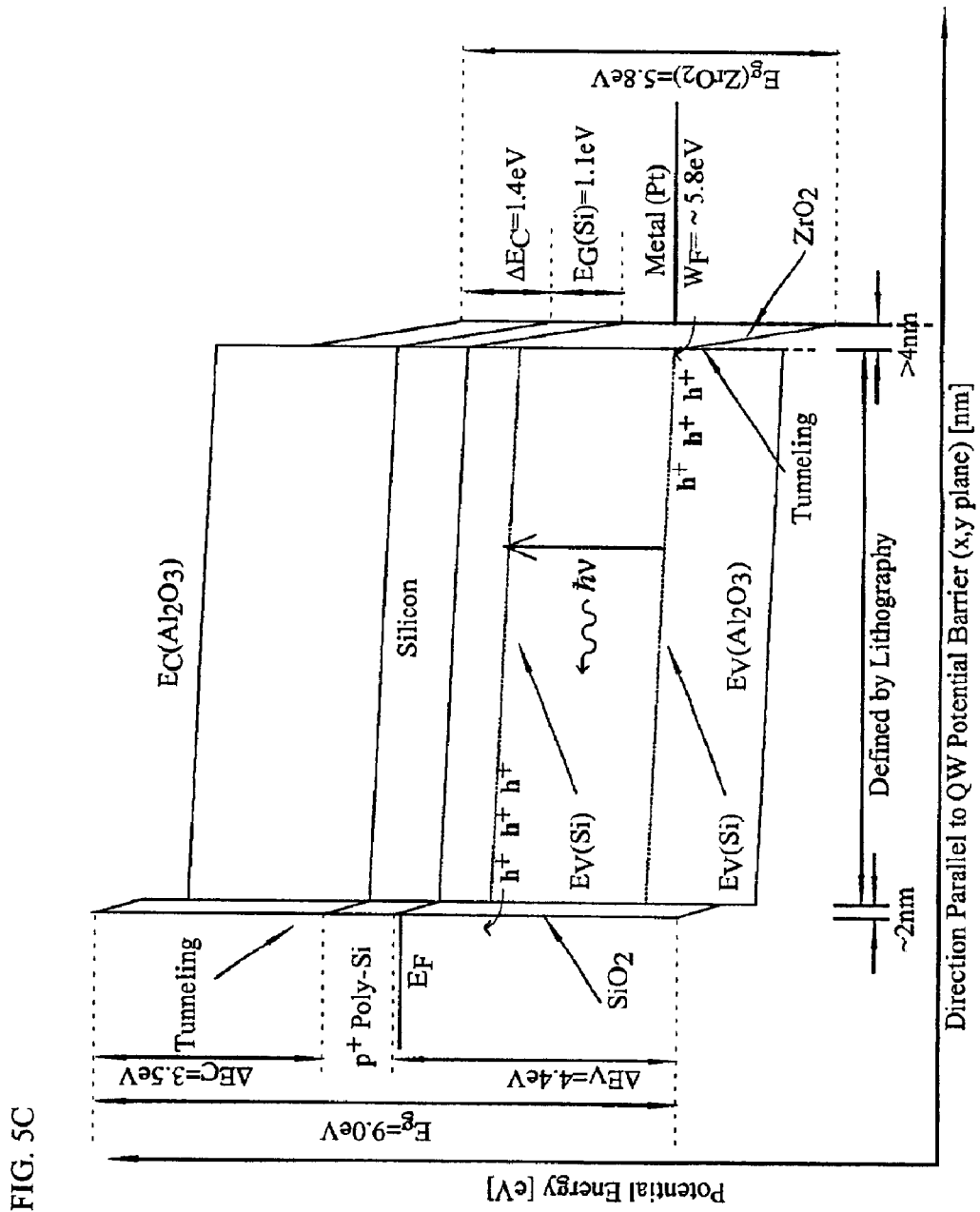

FIG. 5C shows the band-diagram for one of the active-layers, of a cross-sectional cut along the (horizontal) direction between the two contacts. The depicted forward bias condition is suitable for Wavelength-Selective photon-emission, in which the device is transparent to all other wavelengths.

Figure 5D:
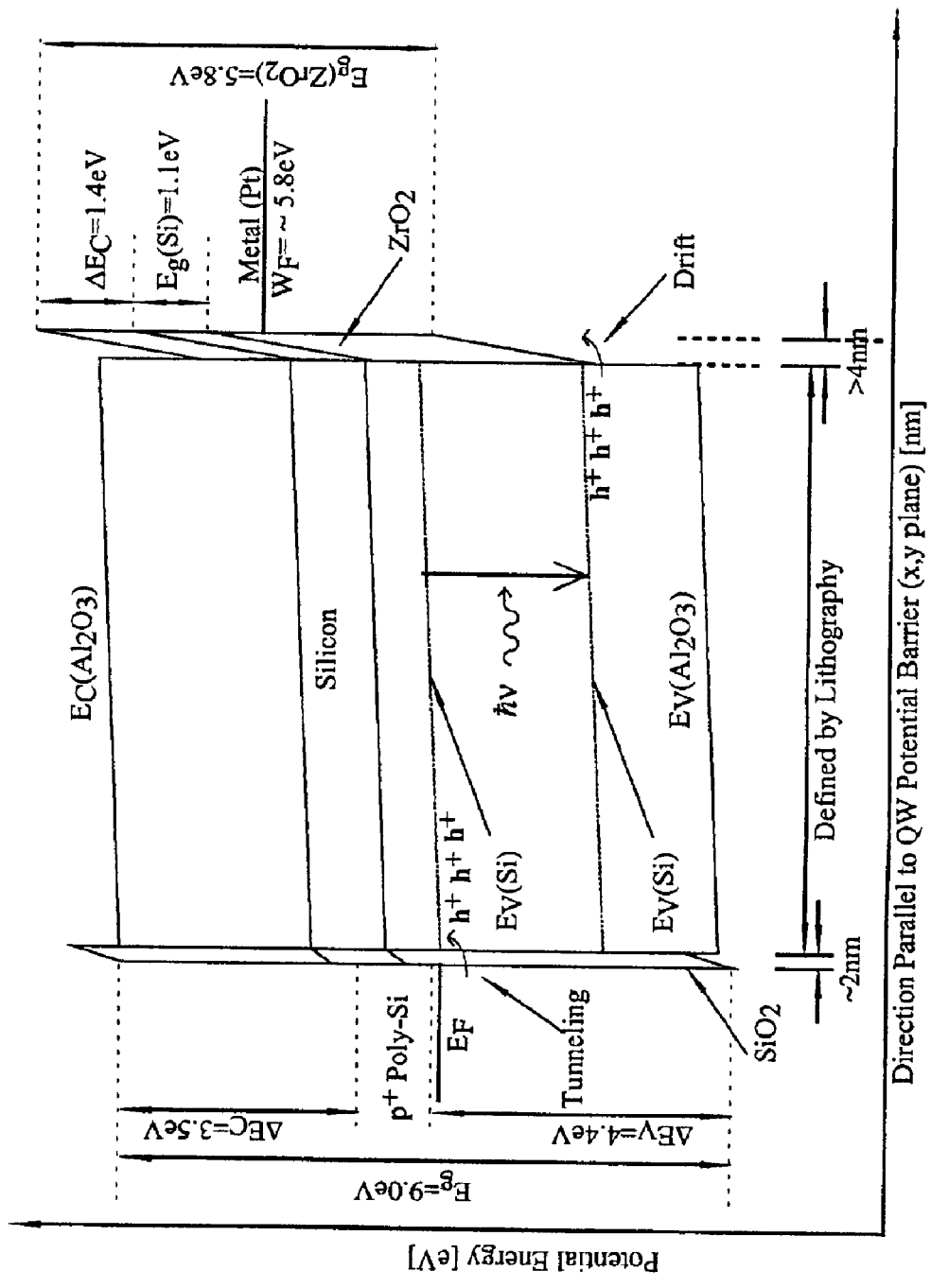

FIG. 5D shows the band-diagram for one of the active-layers, of a cross-sectional cut along the (horizontal) direction between the two contacts. The depicted flat-band bias condition is suitable for neither photon-absorption nor photon-emission, in which the device is transparent to all wavelengths.

In prior art devices operating with intra-subband opto-electronic transitions, such as Quantum Well Infrared Photodetectors (QWIP) and Quantum Cascade Lasers (QCL), the transport of charge carriers takes place in the direction of epitaxial growth, that is, perpendicularly to the active-layer and barrier-layers defining the Quantum Wells. For that reason, for the operation of those devices there is a coupling between the band-gap engineering inducing the energy subbands, and the electric field applied across the QWs, which is required for the purposes of charge injection and extraction. Under these conditions, several compromises and tradeoffs have to be made when engineering the devices.

Prior art [QPL] with lateral contacts does exist, but without band-alignment or work-function engineering of said lateral contacts. As described above, without these there is no possibility to selectively inject/extract charge carriers into/from only a chosen subband, and hence no way to avoid very significant "dark current", that is, current flowing between the "left-hand contact" and the "right-hand contact", without undergoing opto-electronic transitions, photon-absorption or photon-emission. Even if the device could operate with such high "dark current", there would be very detrimental effects on signal-to-noise ratio, and for power dissipation with the consequent heat generation leading to several undesirable effects.

The present invention results in many advantages over the prior art technology in terms of functionality with voltage-controlled different modes of operation, wavelength-selectivity, operating voltage, manufacturing, etc.

The lateral contacts in the Wavelength-Selective Photonic architecture of the invention allow and enable charge transport in the active-layers to be parallel to the barrier-layers, thereby removing constraints with respect to the band-alignment and thickness of the barrier-layers. Thus, there is a decoupling of the subband engineering in the vertical direction of epitaxial growth, from the horizontal charge transport, injection and extraction, in the active-layers. Therefore, very large barrier heights between the active- and the barrier-layers are enabled, for electrons and/or holes, effectively providing the best approximation possible to the "infinitely deep Quantum Well". This feature is highly desirable for very sharp opto-electronic transitions with very narrow linewidths, since it is a key factor for highly selective absorption and/or emission of photons.

With the architecture of the invention, the design of the subbands in the vertical direction, i.e., the direction of epitaxial growth, can be exclusively optimized for the sub-band engineering, impacting wavelength of operation, linewidth, and oscillator strength, while the selective injection/extraction of carriers into/from a particular chosen subband (and no other subbands) in the active-layer is optimized by the band-gap and work-function engineering of the lateral contacts. The materials chosen for the contacts are optimized as a function of the subbands to be contacted.

There are multiple beneficial consequences from selective charge injection/extraction into/from the active-layers. As the presence of charge carriers is required for the opto-electronic transitions, photon absorption and/or emission, the absence of carriers in certain subbands effectively excludes those subbands from interacting with photon.

Functionality and Applications

As shown in the band-diagrams of FIGS. 3B, 3C, 3D, 4B, 4C, 4D, 5B, 5C, 5D, the voltage applied at the lateral contacts controls the mode of operation of the device:
a) "Reverse" bias for device operation as a wavelength-selective photo-detector,
b) "Forward" bias for device operation as a wavelength-selective photo-emitter,
c) "Flat-band" bias for device operation with suppression of both photo-absorption and photo-emission.

Because of the versatility of wavelength-selective devices according to the invention, they can be adapted and optimized for many different fields of application. The flexibility of the invention to absorb or emit light, and to suppress the absorption or emission of light, has no parallel in any of the mentioned prior art (OWIP, QCL, PL). The different modes of operation of a Wavelength-Selective Photonic device according to the invention display a range of functionalities which with prior art required very different devices and/or materials, and/or fabrication techniques.

In addition to the flexibility in terms of the mode of operation, there is also the possibility of designing the device to operate with different wavelengths. It is noteworthy that for some modes of operation, such as Image-Sensor Light-Valves and LED, it is possible to design active-layers and lateral contacts for simultaneous operation with several wavelengths. Given that LASER fabrication requires micro-cavities with large "quality-factor", it is anticipated that it is not possible to combine the simultaneous operation of several wavelengths.

The same device can also be optimized for other functionalities, such as Wavelength-Selective Light-Valves which can operate in visible spectrum, and/or with the IR and/or UV wavelengths. Light-Valves designed for different ranges of wavelengths can be used for displays, optical switches, optical modulators and optical routers, with the latter being especially useful for free-space and fiber-optics communications. Some system architectures for these applications may require the combination of the "Wavelength-Selective Light-Valves" with "Wavelength-Selective Reflectors", made possible with Photonic Band-Gap (PBG) materials. Tuning the Light-Valves and the Reflectors to the same wavelengths, enables completely new solutions for system design, such as Displays, Optical Routers, etc., and for integration with other devices.

A particular and unique advantage of the invention is that the same device or panel implementing the invention can alternatively serve as an Image-Sensor, a Solar-Cell and a Light-Valve.

Further, when being operated at the suitable frame rate, a device incorporating the invention can alternate between the functions of Image-Sensor and Light-Valve, and with appropriate system integration, the same surface will alternately capture or display images. If the images are the same, then the device functions as a mirror. Actually, the same images can be obtained after some signal processing. It should be noted that the invention allows simultaneous imaging in the invisible range of wavelength and therefore totally new functionalities can be built upon such a capability.

Of course, the images do not need to be the same. For example, as a part of a telephone set, either wireline or wireless, this capability would enable videoconferencing with image capture to be sent to the other party and image display of the other party.

Implementing the Image-Sensor and Light-Valve layers by using the Inter-Subband Transitions or Intra-Subband Transitions, that is with very narrow spectral ranges, enables the simultaneous and non-interfering operation of Image-Sensor and Light-Valve functionality if at least a small differentiation exists in the wavelengths of the primary colors used for the Image-Sensor and for the Light-Valve.

The suitably engineered Wavelength-Selective Photonic QWs can be combined with micro-cavities and reflectors, made with Photonic Band-Gap (PBG) materials for example, to fabricate silicon-based LASERs. Consequently, the present invention has the potential to solve the incompatibility problem encountered in the fabrication of LEDs/LASERs, as stated earlier herein, and it enables a qualitative jump in performance, functionality, compactness and price of systems with LEDs/LASERs and ULSI circuitry, by fabricating all these components on silicon substrates.

Wavelength-Selective Multi-Spectral Image-Sensor

The present invention allows innovative photo-detector concepts which can be engineered for many different applications. Some of these applications are based on the device being designed to operate as an Image-Sensor for incorporation into mainstream consumer electronics products, such as Digital Still Cameras, Video Cameras, Camcorders, etc. Due to the multi-spectral capabilities, the sensor can also function simultaneously as an Image-Sensor for non-visible wavelengths (e.g. IR and UV), for applications such as night-vision and through-fog vision.

Given that the absorption of photons is Wavelength-Selective, layers to detect different wavelengths, from the IR, Visible and UV spectra, can all be overlaid, rather than positioned side-by-side as with conventional color image-sensing. Overlaying the color filters provides perfect spatial correlation, for all the wavelengths being detected, and avoids artifacts such as "Moiré patterns".

The selectivity of photo-absorption depending on photon energy can be realized or implemented in several different ways and by operation using Inter-Band Transitions, Inter-Subband Transitions, or Intra-Subband Transitions.

Different ranges of wavelengths translate into different photon energies, which in turn may require different Quantum Well designs. For example, the energy of photons of the mid Infra-Red (IR) spectrum is typically less than 1 eV, which is less than the band-gap of bulk silicon. In order to absorb these wavelengths, Intra-Subband Transitions in the conduction-band (or in the valence-band) of silicon may be used. For these transitions, the conduction band-offset of the QW barriers required for absorption between bound states ("bound-to-bound" transitions) need to be only slightly larger than the energy of the photon. Band-offsets of such magnitude are easy to obtain with QW barriers made of insulators.

The energy of photons in the visible spectrum ranges from ~1.8 eV (color Red) to ~3.1 eV (color Violet). These photon energies are considerably larger than the fundamental (indirect) band-gap of silicon, hence it is possible to design QWs for Inter-Subband Transitions. Since these energies are below the lowest direct band-gap of silicon ($E_{\Gamma 1}$=3.2 eV), it may be more efficient (larger coefficient of absorption) to detect these wavelengths with Intra-Subband Transitions.

However, to absorb these visible wavelengths by Intra-Subband Transitions between bound states, it is required to have conduction- or valence-band offsets larger than the energy of the photon with the shortest wavelength (Violet). According to the conduction- and valence-band offsets listed above for most of the epitaxially compatible insulators on silicon, photons with energy above 2 eV are likely to require QW engineering for Intra-Subband Transitions in the valence-band where very large potential barriers can be obtained between silicon and some wide band-gap insulators.

On the other hand, as mentioned above, the lowest direct band-gap of silicon is $E_{\Gamma 1}$=3.2 eV, and very efficient detection of UV photons (with energies larger than $\hbar\upsilon$=3.2 eV) can be realized with Inter-Subband Transitions.

Therefore, a Wavelength-Selective multi-spectral Image-Sensor in accordance with the invention may combine QWs engineered for different types of opto-electronic transitions, optimized for different ranges of wavelengths.

Image-Sensor Using Inter-Band Transitions

Figure 7A:
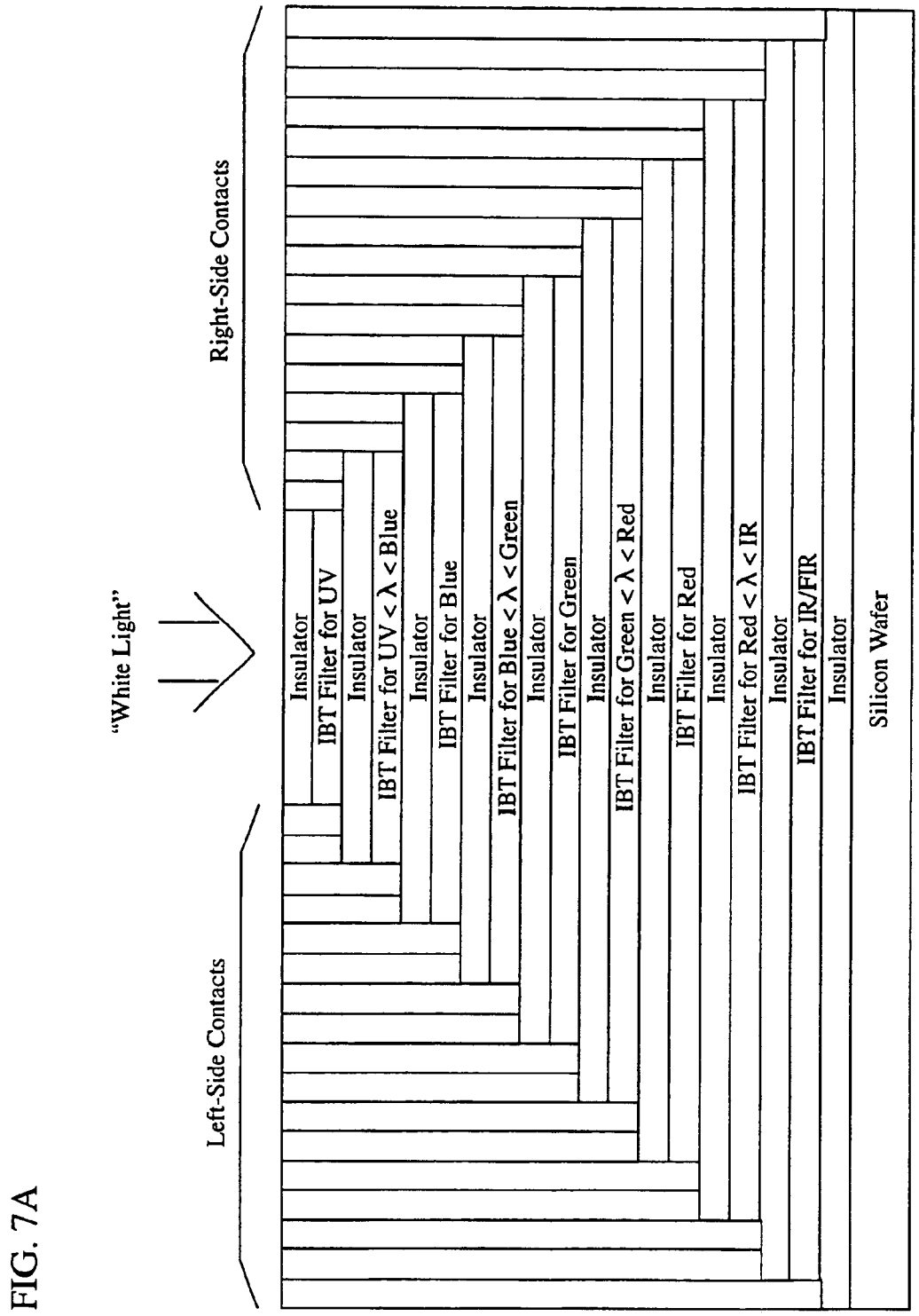
FIGS. 7A–7D show the layer stack and respective band-diagrams for "Wavelength-Selective Image-Sensors" for operation with wavelengths from the visible spectrum and also for Infrared (IR) and Ultra-Violet (UV)

FIG. 7A, shows the implementation of Wavelength-Selective Photo-Absorption (photo-detection) with Inter-Band Transitions.

Band-gap engineering of thick-films, with "bulk-like" properties, can provide "Low-Pass Filters" for the photon absorption. All photons above a certain energy, which is related to the band-gap magnitude and nature of the absorbing medium, are absorbed. The material is transparent for photons below that threshold in energy.

Each film, or set of films with the same properties, in the stack has a different "absorption-edge" and appropriate thickness, in order to absorb nearly all photons with energy above its band-gap.

In order to make a filter for a narrow range of wavelengths, two different absorbing films are required. The "spectral purity" of the filter is proportional to the difference in band-gaps between the two different films.

With Inter-Band photo-absorption, electrons are excited from the valence-band into the conduction-band, thereby creating a hole in the valence band. For bulk semiconductors, the energies allowed to the charge carriers (eigenvalues), are in an energy continuum starting at the lowest energy points of the conduction-band and valence-band.

A photodetector made with "Short-Period SuperLattices" (SLs) should also behave like a "Low-Pass" filter, in which the cut-off wavelength is determined by the gap between the conduction and valence "Minibands".

With superlattices, the "mini-gap" between the conduction- and valence-"minibands" can be varied in an almost continuous way between the band-gaps of the elemental materials used to fabricate the superlattice, by controlling the structural parameters governing the superlattice.

Due to the "Low-Pass Filter" nature of "Bulk" and "Superlattice" Inter-Band absorption, the exact sequence of the film stack must be deposited such that the "absorption edge" increases monotonically, from the bottom to the top of the layer stack. The incoming electromagnetic radiation containing all wavelengths (also called "White Light"), in the Visible, Ultra-Violet (UV) and Infra-Red (IR), must penetrate the stack from the top, where the absorption-edge (band-gap) is wider.

As electromagnetic radiation penetrates through the stack of absorbing layers, at each layer in the stack, its shorter wavelengths (higher energy photons) are absorbed. Therefore only the longest wavelengths (lowest energy photons) reach the bottom of the stack. The charge carriers generated in each "wavelength filter" (which may consist of more that one absorbing layer) are collected laterally. Electrons are collected at one contact, and holes are collected at the other contact. Electrons and holes are separated and driven towards the opposite contacts by a lateral electric field, which can be built-in, may be externally applied, or both.

The spectral purity of a given wavelength filter is determined by the energy difference of the band-gap of the layer immediately above it. For example, the spectral purity of the filter for the color Green, is the result of the difference in band-gaps between the Green-filter itself and the filter to absorb all the colors between Green and Blue. Due to a likely non-linearity in the photon absorption, due to film thickness and photon energy, this physical picture may be somewhat oversimplified. However, the point is that due to the nature of the "Low-Pass Filter", Band-Gap Filtering requires absorbing layers for intermediate wavelengths, between the color filters that demand high spectral purity, like the ones used for imaging.

Full-color Image-Sensors can be made with filters for the three primary additive colors, Red, Green, and Blue (R, G, B). The present invention enables more wavelengths to be sensed simultaneously and without degradation of resolution. The following example of a "stack of filters" also includes layers for IR and UV wavelength sensing. A Wavelength-Selective multi-spectral Image-Sensor, making use of Inter-Band Transitions, can be implemented (from top to bottom) in the following way (FIGS. 7A and 7B):

Top of the detector (where light is penetrates the device)
a) Low-pass filter (can function as Solar-Cell), absorbing wavelengths in the UV.
b) Filter for a particular wavelength in the UV.
c) Low-pass filter (can function as Solar-Cell) for the wavelengths between Blue and UV.
d) Filter for the color Blue.
e) Low-pass filter (can function as Solar-Cell) for the wavelengths between Green and Blue.
f) Filter for color Green.
g) Low-pass filter (can function as Solar-Cell) for the wavelengths between Red and Green.
h) Filter for color Red.
i) Low-pass filter (can function as Solar-Cell) for the wavelengths between IR and Red.
j) Filter for a particular wavelength in the IR/FIR
Bottom of the detector As it can be seen, the list of layers of the epitaxial stack required to perform primary color filtering (IR, R, G, B, WV) with Inter-Band Transitions for imaging purposes, contains not just the three RGB layers, but additional ones for the "inter-primary-color" filtering. The carriers generated in these layers that are not used for imaging, must be collected separately from the ones generated in each of the primary color filtering layers. But rather than wasting these photons they may as well be used to generate electricity. For example, they can be used to self-power a camera.

Again, for all wavelength filters, the electrons and holes are collected laterally and separately. For a given color filter, electrons and holes have separate contacts, with different materials (conductors and insulators). The previously listed sequence of layers and band-gaps may be implemented with silicon-compatible materials and technologies in the following manner:

"Wavelength filters" with a band-gap narrower than that of silicon may be obtained with Group IV alloys and/or superlattices containing all or just a few of the following elements: $Si_{1-x-y-z}Ge_xC_ySn_z$ (with varying stoichiometries).

"Wavelength filters" with a band-gap wider than that of silicon may be obtained with superlattices of Si or $Si_{1-x-y-z}Ge_xC_ySn_z$ (with varying stoichiometries), $Al_2O_3$, or $CaF_2$, or $CdF_2$, for example. Since superlattices require extremely thin films, strain relaxation should not be a problem.

Insulators to electrically isolate different layers, may comprise several materialscan be several, of which the following seem to be the best candidates: $Al_2O_3$ ($E_G \cong 8.8$ eV), $CaF_2$ ($E_G \cong 12$ eV), and $CeO_2$, are insulators, all with large conduction and valence band offsets to silicon. $CdF_2$ ($E_G \cong 8$ eV) has a negative barrier height for electrons with silicon.

Given the compatibility of growing $Al_2O_3$ on silicon, may be used as a buffer layer or template, to enable the growth of other materials, thin or thick films, that normally are not compatible with direct deposition on silicon. $Al_2O_3$ (Sapphire) has been the substrate of choice to grow AlN $E_G \cong 6.0$ eV, GaN ($E_G \cong 3.5$ eV) and AlGaN to make HEMTs, LEDs and LASERs, operating in the blue and violet regions of the electromagnetic spectrum.

Image-Sensor Using Inter-Subband Transitions

Figure 7B:
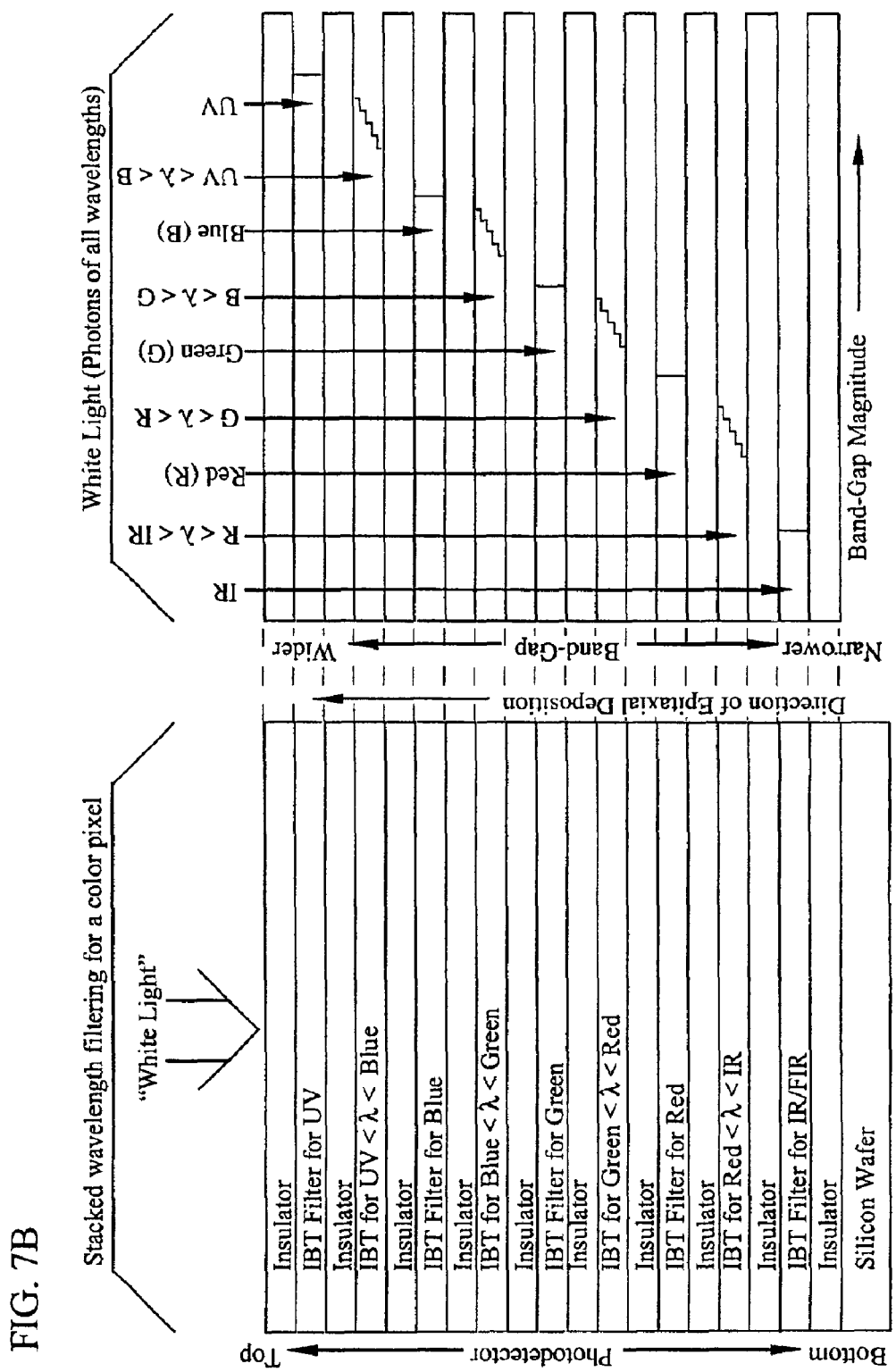

FIGS. 7A and 7B show the implementation of Wavelength-Selective Photo-Absorption (photo-detection) suing Inter-Subband Transitions.

With the quantization effects resulting from the reduced dimensionality of the active-layers, the eigenvalues will no longer be in the continuum at the edges of the conduction- and valence-bands, but will be discretized and shifted away from those band-edges (with geometric progression).

With Inter-Subband Transitions, absorption takes place by scattering of electrons from the valence-band to the conduction-band. However, as the QW becomes narrower, thinner active-layer, the eigenvalues will shift to higher energies the minimum energy of the photons that the semiconductor can absorb, thereby causing an apparent increase in the band-gap of the absorbing material (a blue-shift).

There is another important difference with regards to bulk materials: not only the band-gap appears to become wider, but the QW photo-detector is not a "Low-Pass Filter", since not all photons with energies larger than the difference between the lowest energy subbands in the conduction-band and valence-band will be absorbed.

In order to increase the total absorption coefficient, it may be required to fabricate Multiple Quantum Wells (MQWs) with identical specifications. The exact number of QWs required can be different for each range of wavelengths to be filtered, as slightly different QW engineering parameters may lead to different fractional absorption coefficients.

With this kind of opto-electronic transitions, there is no requirement for monotonically ordering the active-layers according to the energy of the photons to be absorbed, since these devices are not "Low-Pass Filters", but the reverse of "Band-Pass Filters" with very narrow linewidths resulting in very pure colors. This property simplifies considerably the design of the film stack and active-layers.

At the bottom of the film stack, may be grown first Solar-Cell layers, absorbing and generating electricity from the wavelengths that are not used for Image-Sensing. Given the spectral purity of the filtering/absorption of these transitions, it is conceivable to sense a large number of visible or invisible wavelengths or "primary colors" in the same pixel area, without degradation of resolution.

Image-Sensor Using Intra-Subband Transitions

Figure 7C:
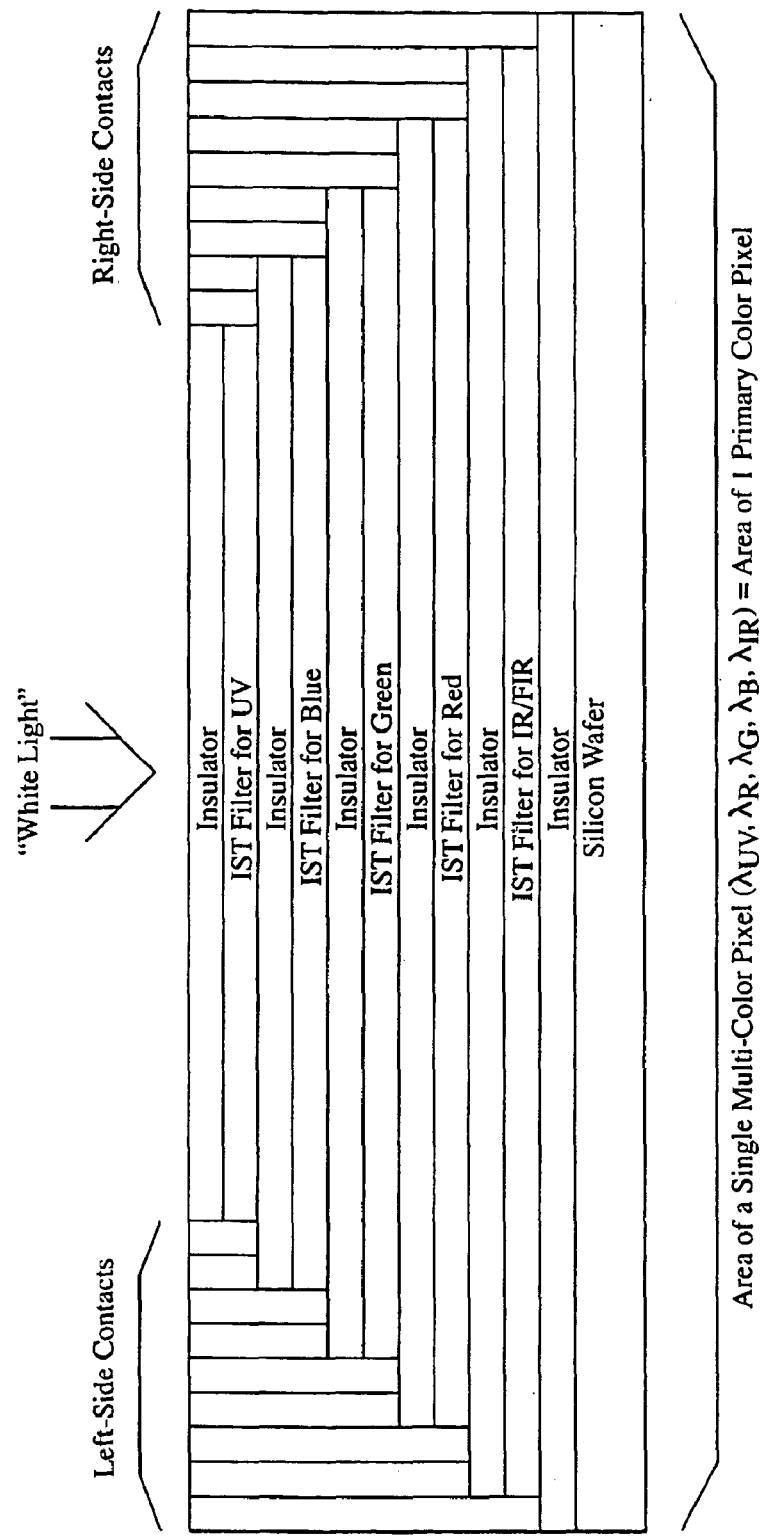
Figure 7D:
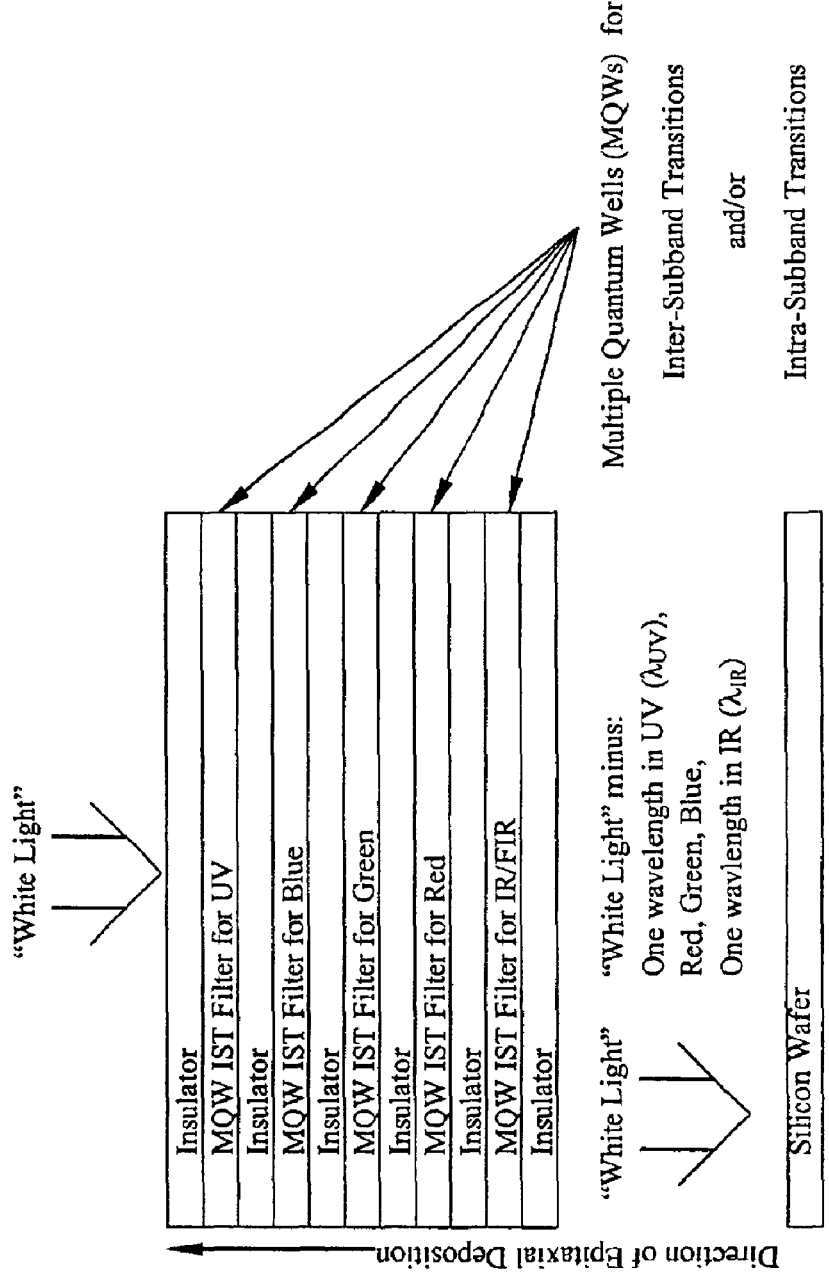

FIGS. 7C and 7D, show the implementation of Wavelength-Selective Photo-Absorption (photo-detection) with Intra-Subband Transitions.

Intra-Subband Transitions can only be implemented with "reduced dimensionality" structures. Since these transitions are unipolar, the contacting materials, their work-function and band-alignments will be different from the ones used for Inter-Subband Transitions.

For these transitions there is also a "blue-shift" as the QWs become narrower with thinner active-layers, and it is possible to engineer QWs for absorption of photons with energies smaller than the "bulk band-gap" of the active-layers, thereby resulting in more flexibility in terms of the wavelengths that can be absorbed.

Intra-Subband Transition devices are not "Low-Pass Filters" since all photons with energy lower or higher than the difference between eigenstates are not absorbed. Only one particular wavelength is absorbed in a delta-like fashion.

Again, the reduced volume of the active-layer in the Quantum Wells, may require the fabrication of identical Multiple Quantum Wells in order to increase the absorption coefficient.

With Intra-Subband opto-electronic transitions, similarly to the previous case of the Image-Sensor by Inter-Subband Transitions, there is no requirement for monotonically ordering the active-layers according to the energy of the photons to be absorbed, since these transitions are not "Low-Pass Filters" but the reverse of "Band-Pass Filters" with very narrow linewidths resulting in very pure colors. This property simplifies considerably the design of the film stack and active-layers.

At the bottom of the film stack it is possible to grow Solar-Cell layers, for absorbing and generating electricity from the wavelengths that are not used for Image-Sensing. Given the spectral purity of the filtering/absorption of these transitions, it is conceivable to sense a large number of visible or invisible wavelengths or "primary colors" in the same pixel area, without degradation of resolution.

Figure 6:
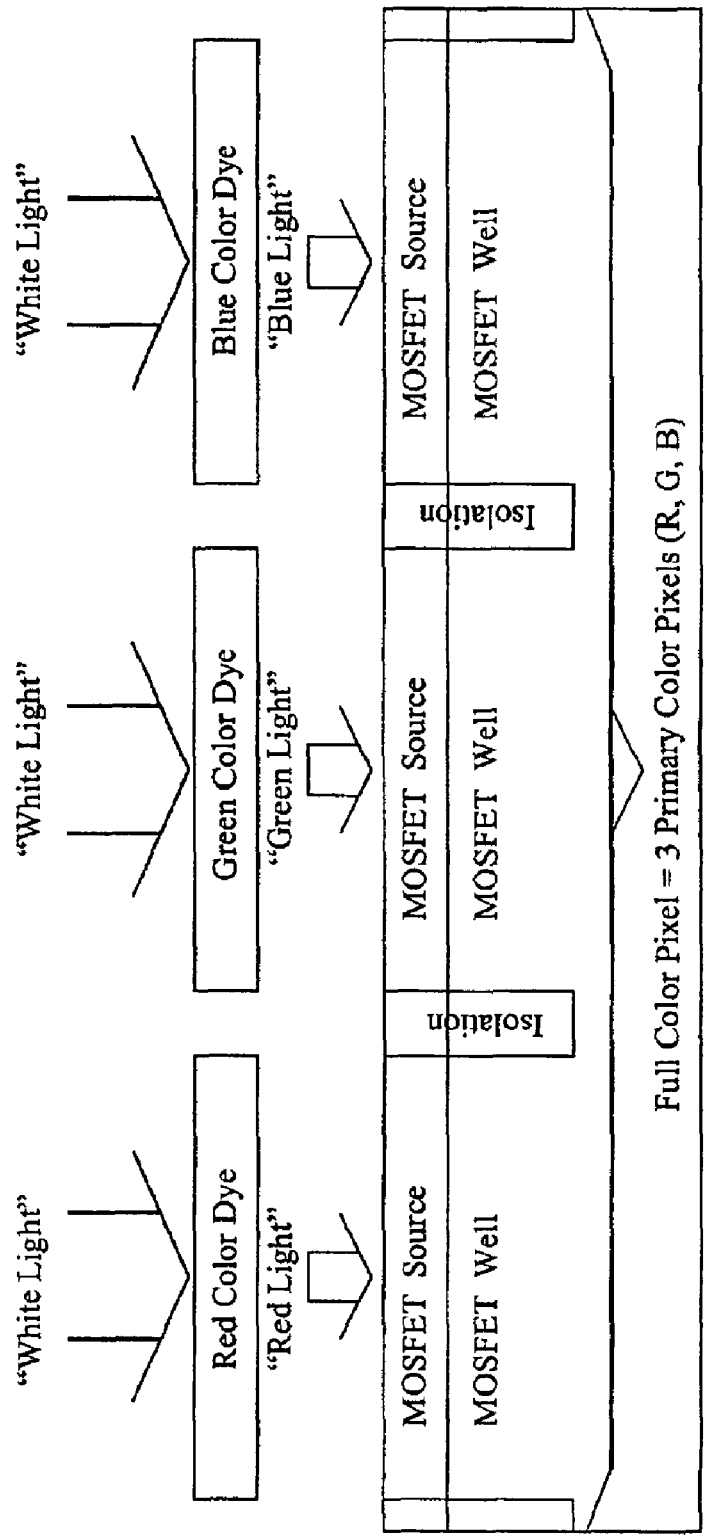
FIG. 6 shows a schematic representation of a color image-sensor from Prior Art.

By way of comparison, an exemplary implementation of a prior art color image sensor is schematically represented in FIG. 6.

Wavelength-Selective Solar-Cell

A multiple band-gap photo-detector as described herein can absorb the same photons that a single band-gap device can, and more because of the possibility of band-gap engineering. But the single band-gap device like standard Solar-Cells wastes all the excess energy that photons have with respect to its band-gap, and therefore that excess energy is not reflected in the "Open-Circuit Voltage".

For a long time, has been predicted that the "ideal maximum efficiency" of a Solar-Cell increases with increasing number of band-gaps connected in series. It can be as high as 72%, which is the double of the "ideal maximum efficiency" of single band-gap mono-crystalline silicon pn-junction solar-cells. While in neither case will the cells attain this "ideal maximum efficiency", it is reasonable to expect that the ratio of efficiencies might not deviate too much from this factor of 2 in favor of Multiple Band-Gap Solar-Cells.

The architecture of Wavelength-Selective Photonic devices of the invention enables stand-alone or embedded Solar-Cells to selectively absorb only certain wavelengths or ranges of wavelengths. As an embedded device, monolithically integrated with other layers performing other functionalities, such as Image-Sensing, Light-Valves, the Solar-Cells according to the invention present unique capabilities to enhance performance and add functionality.

The possible mechanisms for selective absorption of wavelengths have already been explained in the section above for Image-Sensors, and they are basically the same for Solar-Cell operation, with some differences with respect to applied voltages. Whereas photodiodes are operated with an applied reverse bias, whereas Solar-Cells have no applied bias.

With the invention, it is possible to engineer the active-layers and barrier-layers for an almost continuously variable band-gap. It is also possible to define and electrically isolate groups of band-gaps, and arbitrarily change the topology of the connections, series and parallel, thereby providing means of adaptation to changing lighting conditions, whether it is intensity (photon flux), or spectral signature (changing wavelengths).

In its simplest form, the "series" arrangement of the Solar-Cells can be best achieved by in-situ doping during the heteroepitaxial deposition of the several layers with different band-gaps. A more complex implementation may include separate contacts to several active-layers in the stack, which may or may not be separated by insulator layers. The extra contacts enable to dynamically change the electrical connections between different groups of active layers with different band-gaps. This provides a way to dynamically adjust the tradeoff between "Open-Circuit Voltage" and "Short-Circuit Current". These changes can be made to better adjust the overall efficiency of the Solar-Cell depending on the lighting conditions, in terms of the number (intensity) and wavelength (spectral distribution) of the photons.

Figure 8A:
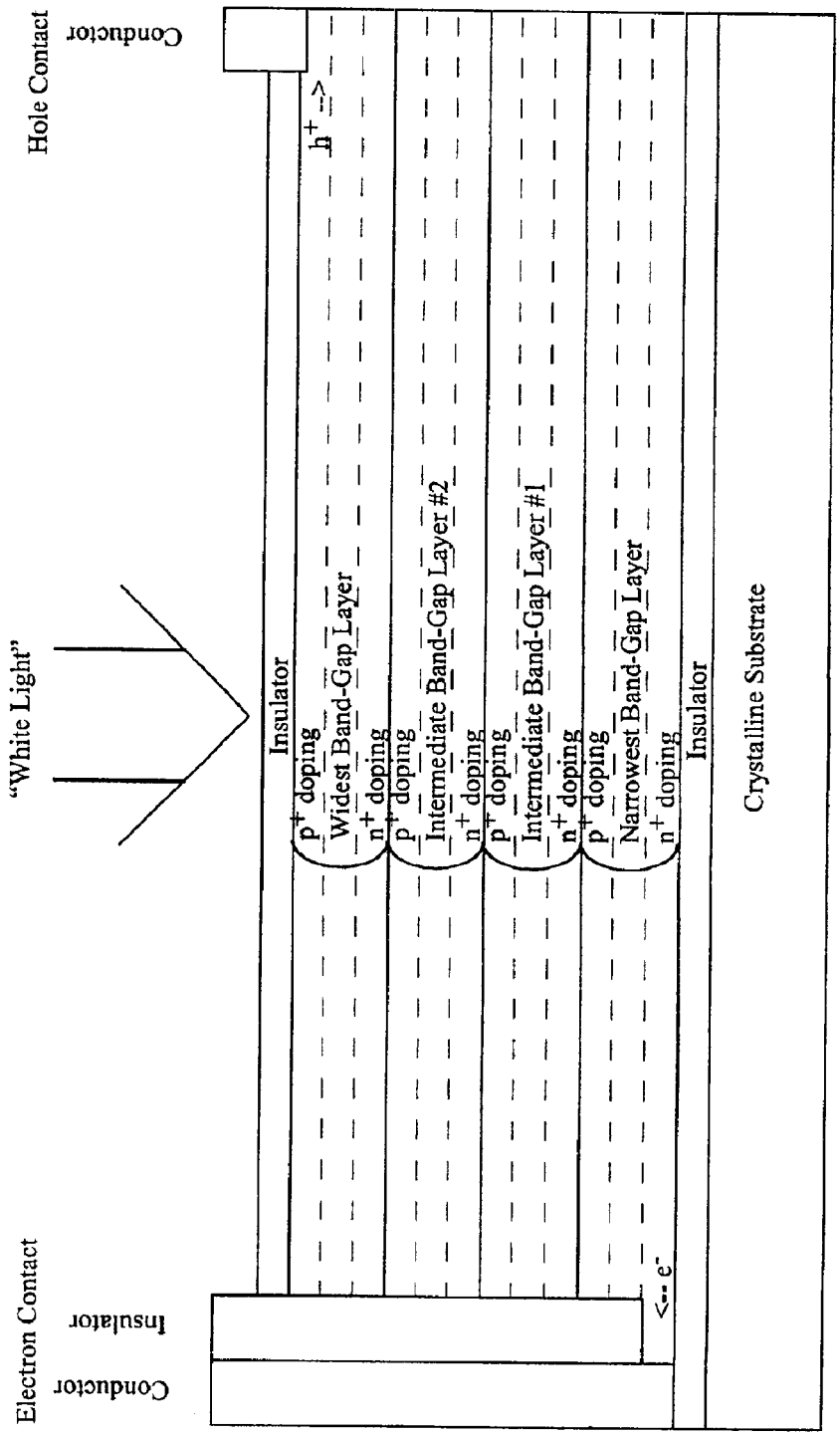
FIG. 8A illustrates the application of the invention, using Inter-Band Transitions, to function as a Solar-Cell, without specifying the materials.

FIG. 8A schematically shows the structure for a Solar-Cell, without specification of the materials. The implementation with materials compatible with silicon is fairly easy and straightforward in order to obtain band-gaps narrower than that of silicon, but it is more difficult for band-gaps wider than that of silicon.

Narrower band-gaps than that of silicon may easily be obtained with the epitaxial deposition of random alloys and/or superlattices of $Si_{1-x}Ge_x$, $Si_{1-y}C_y$, $Si_{1-z}Sn_z$ or any combination of them as $Si_{1-x-y-z}Ge_xC_ySn_z$.

Wider band-gaps than that of silicon may be obtained in several ways. It should be possible to achieve a smooth increase in band-gap through "Minibands" resulting from "Short-Period SuperLattices" (SLs) of silicon and wider band-gap materials, epitaxially compatible with silicon. Examples of such materials have already been given in previous sections of the present disclosure. N-type and p-type doping of the superlattice layer may be required for vertical series connection without lateral contacts to every single set of layers with a particular band-gap. It is also possible to connect active-layers operating with Inter-Subband and Intra-Subband Transitions as elements for power generation.

Figure 8B:
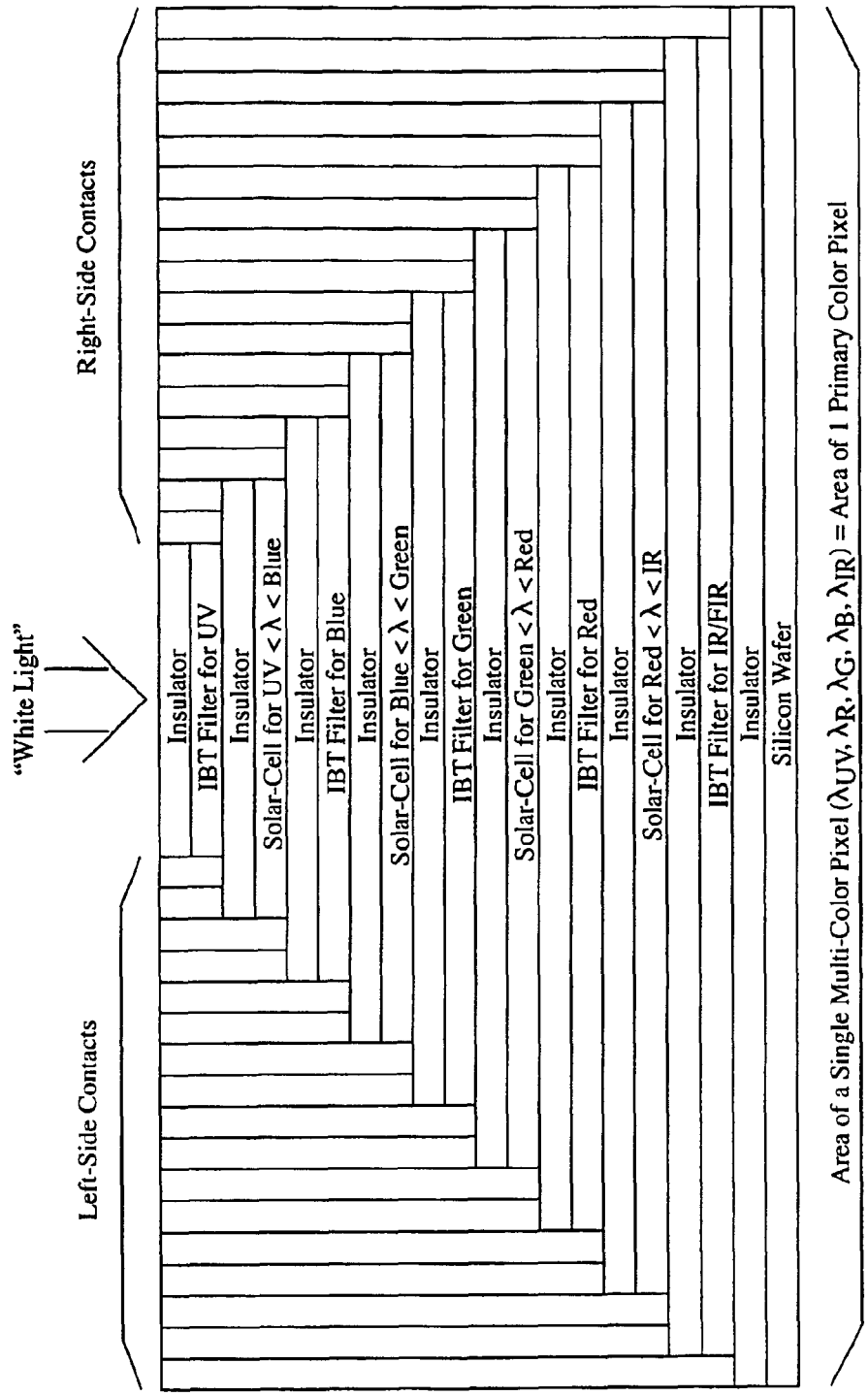
FIG. 8B illustrates the application of the invention for use as an Image-Sensor monolithically integrated with a Solar-Cell, wherein the Image-Sensor operates on Inter-Band Transitions (IBT) in bulk-like or superlattice active-layers.
Figure 8C:
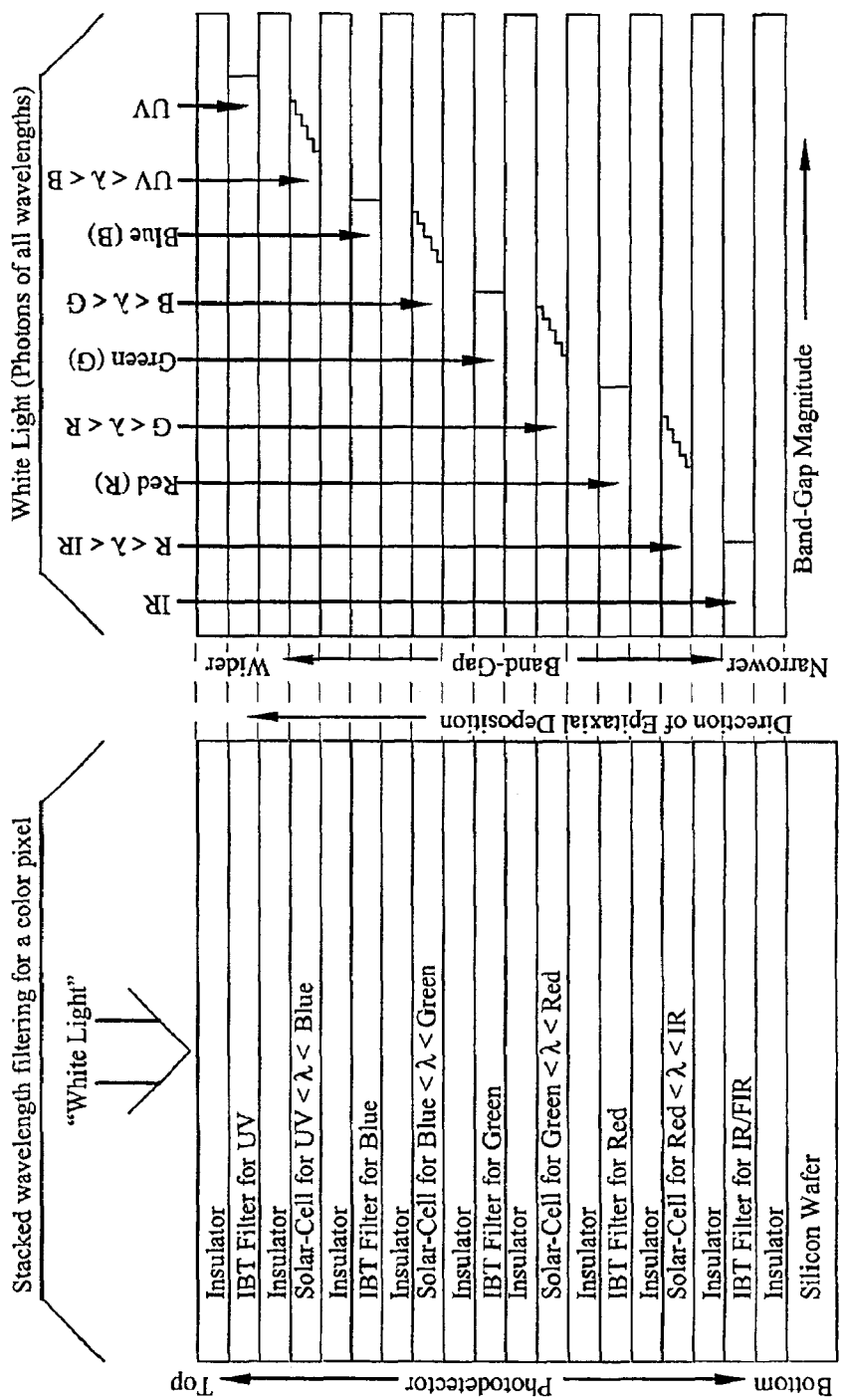
FIG. 8C shows the layer stack of FIG. 8B together with the corresponding band-gap sequence and wavelength selectivity thereof.

FIGS. 8B and 8C show the Solar-Cell of the present invention embedded into a Image-Sensor operating through Inter-Band Transitions (IBT). In this implementation the Solar-Cell layers consist of the layers required to provide high spectral purity to the wavelengths being filtered by the Image-Sensor. The functionality of Solar-Cells is a byproduct of the physical effects through which photon absorption takes place.

Figure 8D:
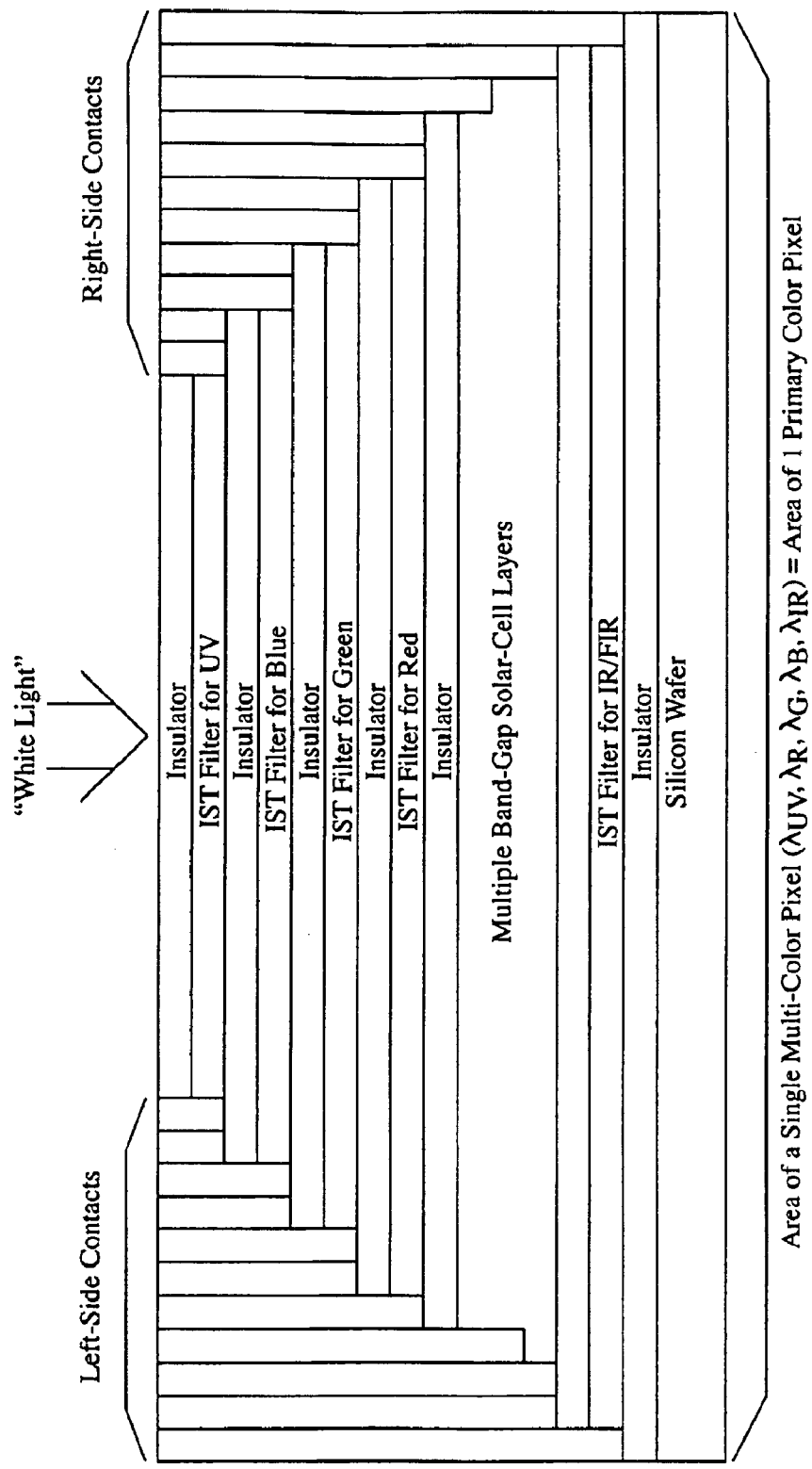
FIG. 8D illustrates the application of the invention for use as an Image-Sensor monolithically integrated with a Solar-Cell, wherein the Image-Sensor is to operate on Inter-Subband Transitions or Intra-Subband Transitions (both abbreviated as "IST"), in quantized structures like "Multiple Quantum Wells" (MQWs) active-layers.
Figure 8E:
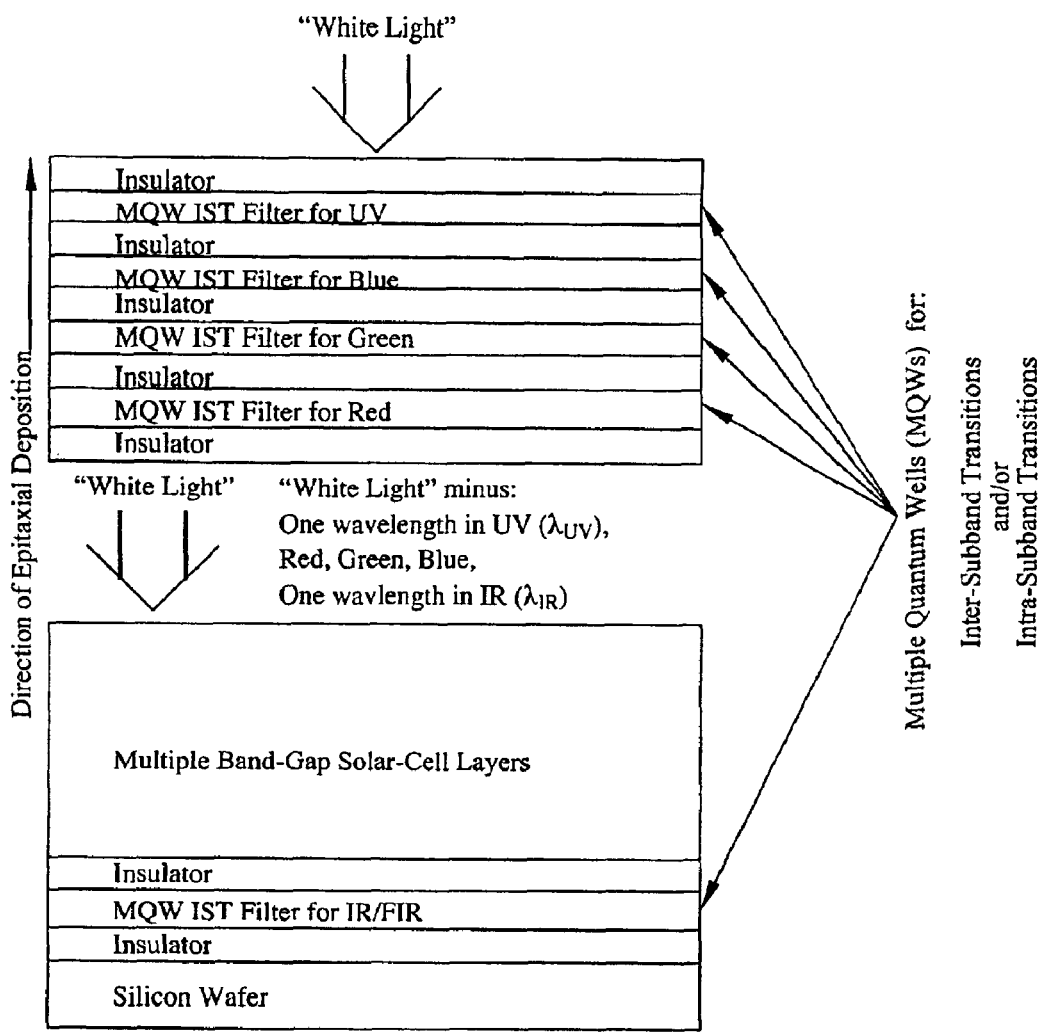
FIG. 8E depicts the layer stack of FIG. 5D showing the how "white light" penetrates the Image-Sensor layers, which selectively absorb a few wavelengths, and how most of the electromagnetic radiation reaches the Solar-Cell layers.

FIG. 8D and 8E show the Solar-Cell of the present invention embedded into a Image-Sensor operating through Inter-Subband Transitions or Intra-Subband Transitions (both abbreviated as "IST"). Given the selectivity of photon-absorption through these opto-electronic transitions, almost all wavelengths in the "white light" travel through the MQWs for Image-Sensing without interaction. Therefore it is straightforward to place specific Solar-Cell films positioned "after" the MQWs, in order to absorb the wavelengths which were not captured for Image-Sensing purposes.

Wavelength-Selective Multi-Spectral Photon-Emission (LED and/or LASER)

As already shown in FIGS. 3D, 4D and 5D, devices according to the invention can have its active-layers, lateral contacts, and applied voltage, optimized for photon-emission rather than photon-absorption.

The invention provides a device architecture which enables very wide potential barriers, such that the subbands in the conduction band of silicon, which are involved in opto-electronic transitions, are positioned above the direct band-gap of silicon, thereby enabling efficient light emission with Inter-Subband Transitions.

At the same time it is also possible engineer devices to take advantage of Intra-Subband Transitions in the conduction or valence-band of silicon, thus bypassing the issue of band-gap type and magnitude of bulk silicon.

The insertion of Quantum Well(s) in a micro-cavity and further optimization of the subbands enables the fabrication of Wavelength-Selective Photonic LASERs.

For Inter-Subband Transitions using the direct band-gap(s) of silicon, the insulator/conductor contact injecting electrons into the subband of the conduction-band would have the conduction-band edge of the contact-insulator slightly above the subband level in the active-layer, and the work-function value of the contact-conductor should be small enough to be above the conduction-band edge of the contact-insulator. The insulator/conductor contact injecting holes should have the edge of the valence-band of the contact-insulator below (higher potential energy) the level of the hole subband in the active-layer, and the work-function value of the contact-conductor should be large enough to be slightly below the valence-band edge of the contact-insulator.

For Intra-Subband Transitions in the conduction-band, the insulator/conductor contact injecting electrons into the "excited subband" would have the conduction-band edge of the insulator, which is thick enough to prevent tunneling, slightly above the subband level, and the work-function value of the conductor should be small enough to be above the conduction-band edge of the insulator. For the contact collecting electrons from the "ground subband", the insulator is thin enough for efficient tunneling, and the work-function value of the conductor should be roughly aligned with the "ground subband".

For Intra-Subband Transitions in the valence-band, the insulator/conductor contact injecting holes into the "excited subband" would have the valence-band edge of the insulator, which is thick enough to prevent tunneling, slightly below the subband level, and the work-function value of the conductor should be large enough to be below the valence-band edge of the insulator. For the contact collecting holes from the "ground subband", the insulator is thin enough for efficient tunneling, and the work-function value of the conductor should be roughly aligned with the "ground subband".

Wavelength-Selective Multi-Spectral Light-Valve

The operating principle of a wavelength-selective multi-spectral Light-Valve is the active control of photon-absorption or suppression of photon-absorption. The fundamental mechanism of control is the modulation of the number of charge carriers injected/extracted into/from the subbands involved in the opto-electronic transitions. This control is achieved with the applied voltage at the lateral contacts as shown in FIGS. 3B & 3C, 4B & 4C, and 5B & 5C.

The Light-Valve is transparent when photon-absorption is suppressed and it is opaque when photon-absorption is enabled. Since the number of absorbed photons can be increased with increasing number of QWs in the Multiple Quantum Well stack for a particular wavelength, the On/Off ratio (opacity/transparency ratio) of the Light-Valve can be increased with more QWs for a particular wavelength.

For a single QW or any given number of QWs working at the same wavelength, maximum "dynamic range" or "contrast ratio" of the Light-Valve, is achieved by minimizing the number of photons absorbed in the transparency state and maximizing the number of photons absorbed in the opacity state.

No photons are absorbed for a fully depleted "ground state" subband and/or a fully populated "excited subband". Conversely, maximum absorption occurs when the "ground state" subband is permanently replenished with charge carriers and when the "excited state" subband, receiving the photo-excited charge carriers, gets very quickly depleted of those carriers.

Therefore, Wavelength-Selective Light-Valves are based on Wavelength-Selective Image-Sensors and a single device could sequentially perform both functionalities provided the lateral contacts are suitably chosen. In fact when the Light-Valve for any given pixel is in the opaque state, it is performing photo-absorption, which could be used for Image-Sensing purposes.

Wavelength-Selective Multi-Spectral Light-Valves for Displays

As mentioned before, Wavelength-Selective Photonic devices can be designed to operate in different ranges of wavelengths, including IR, Visible, and UV. The exact opto-electronic mechanisms may be different for different ranges of wavelengths, and in turn the materials for the lateral contacts are also likely to be different for wavelengths in the IR or Visible or UV spectra. However, the Wavelength-Selective Photonic architecture of the invention allows for monolithic integration for all the device layers necessary to perform the required functionalities for each wavelength.

Wavelength-Selective Light-Valves operating with wavelengths in the Red, green and Blue colors, can be incorporated into "transmission displays" or "reflective displays". In the first case, the light sources must be monochromatic and emit at the exact same wavelengths as the Wavelength-Selective Light-Valves.

Figure 9A:
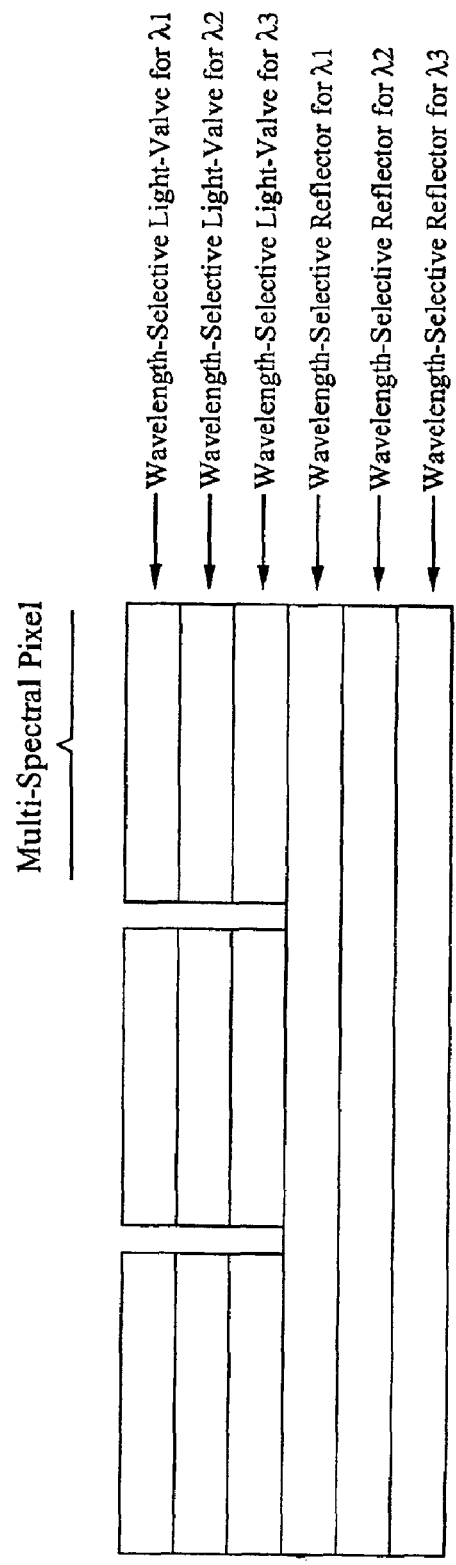
FIGS. 9A, 9B, show the layer stack and respective band-diagrams for "Wavelength-Selective Light-Valves" for operation with wavelengths from the visible spectrum and also for Infrared (IR) and Ultra-Violet (UV). The Light-Valves may consist of layers operating through Inter-Subband Transitions, Intra-Subband Transitions in the conduction-band and Intra-Subband Transitions in the valence-band. The basic device physics, which comprises the control of photon-absorption and suppression of photon-absorption is shown in FIGS. 3B & 3C, 4B & 4C, and 5B & 5C.

Reflective displays may present the most interesting implementation of Wavelength-Selective Light-Valves for displays. By combining and integrating in a monolithic fashion the Wavelength-Selective Light-Valves with Wavelength-Selective Reflectors, as shown in FIG. 9A, it is possible to fabricate a solid-state reflection display. Wavelength-Selective reflectors may be made with Photonic Crystals or Photonic Band-Gap (PBG) materials, which can be engineered to selectively reflect some wavelengths while being transparent to others. This new kind of display requires that the wavelengths which are absorbed by the Light-Valves to be the same that are reflected by the Reflectors. All other wavelengths travel trough the display and can be utilized for other purposes and functionalities, such as Image-Sensors and Solar-Cells.

Given that the linewidths of the opto-electronic transitions enabling absorption and suppression of absorption of light are very narrow, and given the fact that a fairly large range of wavelengths is perceived as the same color by the human eye, it is possible to design Wavelength-Selective Image-Sensors and Wavelength-Selective Light-Valves to operate with wavelengths that, while being different, still correspond to the same perceived primary color. It is thus possible to combine and monolithically integrate full color Wavelength-Selective Image-Sensors and Wavelength-Selective Light-Valves, in which both functionalities are performed on separated sets of films, and can be operated simultaneously in a fully independent manner.

The capability of modulating the opacity or transparency of a given layer for a range of wavelengths, provides the functionality of "Wavelength-Selective Light-Valves". It must be emphasized that Wavelength-Selective "Light-Valves" do not require polarizers and therefore allows more light to go through the device when in the "transparency state".

Wavelength-Selective Multi-Spectral Light-Valves for Optical Communications

Figure 9B:
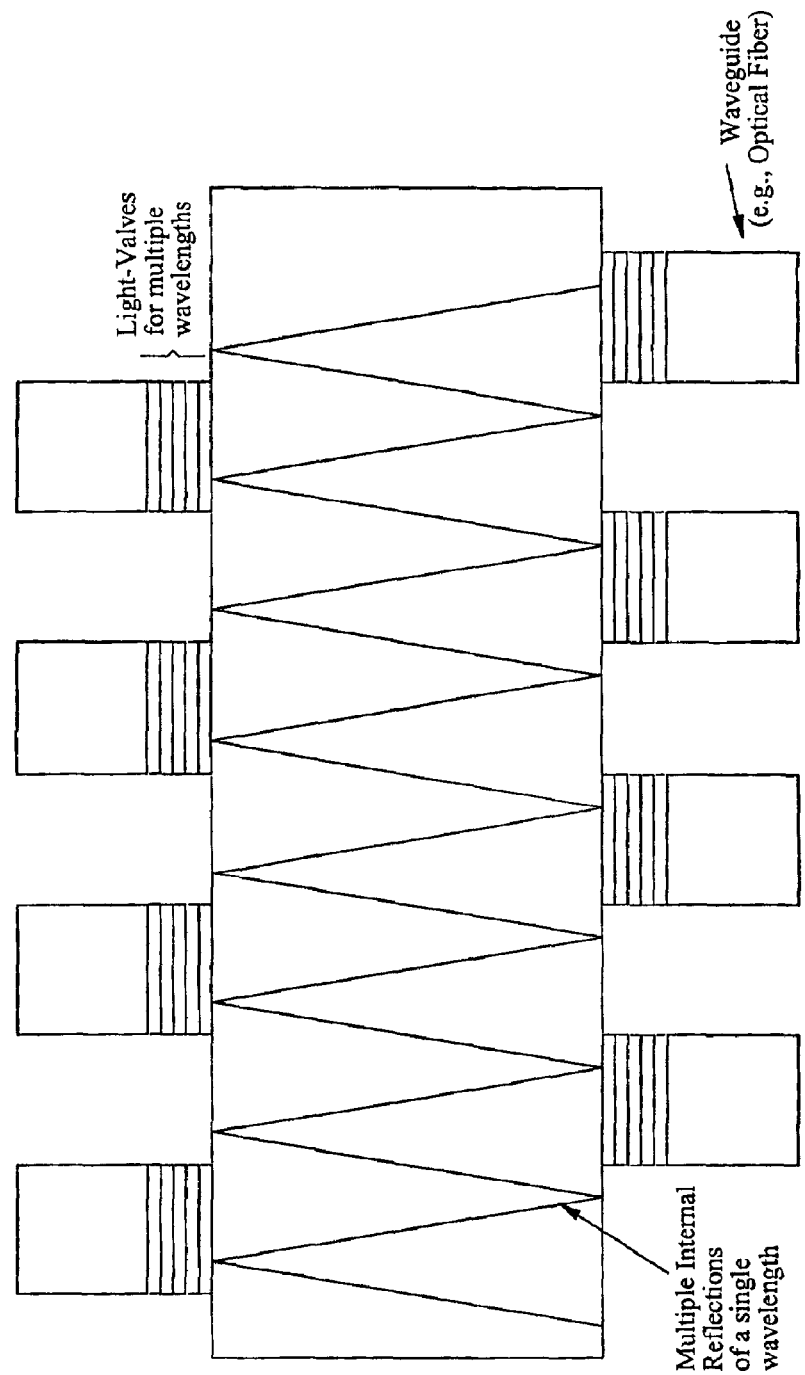

FIG. 9B shows the schematic of an exemplary arrangement for "Switching" and/or "Amplitude Modulation" and/or Multiplexing/Demultiplexing, and/or Routing with a number of Wavelength-Selective Light-Valves. This arrangement works by simply controlling the transparency and opacity states of a number of Wavelength-Selective Light-Valves positioned as a 2D array on a low-loss planar waveguide. The arrangement can work with the 2D arrays of light-valves on just one side or on both sides of the planar waveguide.

When a Light-Valve is in the transparency mode for a given wavelength, photons of that particular wavelength can travel through it with little or no absorption. When the Light-Valve is in the opacity mode a particular, photons of that particular wavelength are absorbed, and therefore the signal amplitude is strongly reduced. The incoming and outgoing signal may reach the "modulator" either by an optical fiber or some other kind of waveguide. Therefore, the sources of photons for each of the wavelengths (LASERs), can operate in a continuous mode and are not required to do the modulation themselves.

Once coupled and confined in the planar waveguide, the incoming light beams suffer many reflections from the internal walls of the waveguide, so that each port, or element of the 2D array, receives a fraction of the intensity of the original light beams. The control of the Light-Valves allows or forbids the propagation of photons (of the different wavelengths) through said Light-Valves.

This scheme does not route all the photons of the incoming light beams into a single optical path but rather, distributes the incoming light beams through all possible optical paths. Therefore, through the controlling of the transparency and opacity states of the Light-Valves, there is control of which optical paths allow propagation of the light beams, and which do not. Because the outgoing light beams have just a fraction of the intensity of the incoming light beams regeneration of the optical signals after each port is likely to be necessary.

It should be emphasized that the capabilities just described are available to many wavelengths simultaneously because the Light-Valves are Wavelength-Selective. Because of this wavelength-selectivity of Light-Valves according to the invention, a single port could be in the "transparent" state for some wavelengths and in the "opacity" state for others. Therefore it is even possible to have full bi-directionality, provided there is no conflict with the selection of wavelengths "going in" and "coming out" through that port. Therefore, this can also accomplish wavelength-division multiplexing and demultiplexing.

This is an "all-optical" routing scheme because even though the photons directed to the non-selected optical paths are photo-absorbed, that is, converted into electricity, the light beams travelling through the selected optical paths do so without conversion to electrical signals at any point.

With this architecture, the routing can be "point-to-point", if just one Light-Valve is in the transparency mode, or "point-to-multipoint" if many Light-Valves are transparent at the same time. Again, because of the wavelength-selectivity, it is possible to have point-to-point routing for one color and point-to-multipoint for another color or color(s).

Due to the design architecture of this circuit, multiple functionalities, such as Switching, Amplitude Modulation, Multiplexing/Demultiplexing, and Routing, are fulfilled by a single and very compact architecture.

FIG. 9A may provide an equally compact architecture to implement the same functionalities as FIG. 9B, but achieved with a different design. The concept combines Wavelength-Selective Light-Valves and Wavelength-Selective Reflectors made with Photonic Band-Gap (PBG) materials designed for the same wavelengths. For a reflection system, when light beams are not absorbed in the Light-Valves, mirrors positioned behind the Light-Valves reflect them back with the desired direction and shape. In this design, light is not coupled to the Light-Valves through waveguides, but through free space.

The Light-Valves are patterned to form a 2D array (matrix) of pixels, which have critical dimensions smaller than half of the wavelength of the photons that it interacts with. The geometrical effect of sub-wavelength pixelized Light-Valves in the "On" and "Off" states results in a high-resolution diffraction pattern enabling "wavefront engineering" independently for each wavelength. Wavefront engineering of coherent light makes possible to do "Beam Shaping" and "Beam Steering" in free space, thereby proving a very simple solution to the problem of directing light into one or many directions.

The dynamic control of the diffraction pattern is achieved with the dynamic switching between "On" and "Off" of the sub-wavelength 2D array of pixelized Light-Valves. For Light-Valve pixels in the opaque state, photons are absorbed, and therefore a dark spot is created. For Light-Valves in the transparent state, photons are not absorbed, and bounce off the Wavelength-Selective Reflector.

Fabricating sub-wavelength pixelized Light-Valves for the $\lambda=1310$ nm and $\lambda=1550$ nm wavelengths is fairly easy, since in 2001 the microelectronics industry entered the mass production of CMOS structures with critical dimensions of 130 nm, that is, structures at least 10 times smaller than the shortest wavelength used for fiber optics communications.

Each pixel in the matrix of Light-Valves is controlled by electronic circuitry, which may be located at the periphery, or positioned inside each pixel next to the Light-Valves.

Because the routing is accomplished with switching elements, producing a diffraction grating, the same routing elements can also perform switching and amplitude modulation. The combination of these functionalities into a single device is only useful and advantageous because of the intrinsic high switching speed of the Wavelength-Selective Light-Valves. This combination brings numerous advantages in terms of compactness and cost over the more conventional solutions, like Liquid Crystal Light-Valves, electrical modulation of LASERs, and Light-Valves made with MOEMS—Micro-Opto-Electronic-Mechanical-Systems).

Again, it must be emphasized that Wavelength-Selective "Light-Valves" do not require polarizers, and therefore allows more light to go through the device when in the "transparency state".

Monolithic Integration with other Devices

The fabrication of the active-layers and barrier-layers in the process according to the invention is controlled with atomic layer precision during the epitaxial growth at low temperature. The fabrication of Wavelength-Selective devices does not require ion-implantation and/or high temperature steps. Therefore it is straightforward to incorporate epitaxial device layers for other devices whose fabrication does not requires ion-implantation and/or high temperature steps either.

One example of such a device is the "Heterojunction Integrated Thermionic Cooler" (HIT). Such a device is based on heterostructures, which with suitable applied voltage, have the capability of lowering the temperature in adjacent materials.

These devices can be implemented with silicon compatible materials and structures, but are not straightforward to monolithically integrate with "planar technology", because ion-implantation and high temperature steps are susceptible to induce defects in the active layers of heterojunction devices.

For Wavelength-Selective devices, it is especially attractive the possibility of cooling down (with respect to Room Temperature) the active-layers dedicated to Far-Infra-Red (FIR) operation, such as photo-absorption, photo-emission. Since the engineering of the energy levels in the active-layers depends on the energy of the photons to interact with, the longer the wavelength the smaller the difference between the energy levels in the active-layers. When the difference in energy between two levels becomes comparable to thermal energy, it is very likely for charge carriers to change levels just by thermal excitation.

Therefore, lowering the temperature of the active-layers lowers the thermal energy compared to energy of the photons and thus compared to the difference in energy between the levels (eigenvalues). As a result, the signal-to-noise ratio of the Mid-Infra-Red and Far-Infra-Red signal detection are greatly improved.

In FIG. 8E there is shown the monolithic integration of Image-Sensors for multiple wavelengths in the visible and UV, with multiple band-gap Solar-Cell layers, and with Image-Sensing for a wavelength in the IR or FIR. The photo-detection layers for FIR are the ones that can profit most from lowering the temperature of the layers. Therefore it is straightforward to add the films for "cooling" at the bottom of the stack, immediately under the active-layers for FIR sensing. With this configuration, the electrical power for cooling may be provided by the Solar-Cells embedded in the film stack.

What is claimed is:

1. An opto-electronic device comprising:
   a crystalline substrate;
   an insulator layer coextensive with a top surface of the crystalline substrate;
   an epitaxial stack of alternating photon-active semiconductor layers and electrical-insulator layers above a central part of the top surface of the insulator layer;
   first contact means formed on a first edge part of the top surface of the insulator layer;
   said first contact means extending parallel with a direction of epitaxial deposition and being in contact with one side wall of at least one active semiconductor layer for extracting electrons from or injecting electrons into the active semiconductor layer(s) associated therewith;
   second contact means formed on a second edge part of the top surface of the insulator layer; and
   said second contact means extending parallel with the direction of epitaxial deposition and being in contact with a second side wall of at least one active semiconductor layer for extracting holes from or injecting holes into the active semiconductor layer(s) associated therewith.

2. An opto-electronic device as claimed in claim 1, wherein each active semiconductor layer is comprised of a silicon-compatible alloy compound.

3. An opto-electronic device as claimed in claim 1, wherein said first and second contact means each comprise a conductor part and an insulator part extending parallel with the direction of epitaxial deposition of the epitaxial stack.

4. An opto-electronic device as claimed in claim 3, wherein the insulator part of each of said first and second contact means has a thickness defined depending on whether tunneling is desirable or not.

5. An opto-electronic device as claimed in claim 1, wherein the active semiconductor layers include quantum wells.

6. An opto-electronic device comprising:
   a crystalline substrate;
   an insulator layer coextensive with a top surface of the crystalline substrate;

an epitaxial stack of alternating photon-active semiconductor layers and electrical-insulator layers above a central part of the top surface of the insulator layer;

said epitaxial stack comprising at least two successive different groups of alternating photon-active semiconductor and insulator layers;

the layers in the different groups having a different length and having a different band-gap;

first contact means associated with each of said groups and formed on a first edge part of a top surface of the insulator layer underneath each associated group of layers in the epitaxial stack;

each of said first contact means extending parallel with a direction of epitaxial deposition;

each of said first contact means being in contact with one side wall of the active semiconductor layers in said associated group for extracting electrons from or injecting electrons into the active semiconductor layers in said associated group;

each of said first contact means being separated from an adjacent first contact means by an insulator spacer;

second contact means associated with each of said groups and formed on a second edge part of the top surface of the insulator layer underneath each associated group of layers;

each of said second contact means extending parallel with the direction of epitaxial deposition;

each of said second contact means being in contact with a second side wall of the active semiconductor layers in said associated group for extracting holes from or injecting holes into the active semiconductor layers in said associated group; and each of said second contact means being separated from an adjacent second contact means by an insulator spacer.

7. An opto-electronic device as claimed in claim 6, wherein each active semiconductor layer is comprised of a silicon-compatible alloy compound.

8. An opto-electronic device as claimed in claim 6, wherein the active semiconductor layers in the successive groups are arranged with pre-selected monotically increasing band-gaps.

9. An opto-electronic device as claimed in claim 6, wherein said first and second contact means each comprise a conductor part and an insulator part extending parallel with the direction of epitaxial deposition of the epitaxial stack.

10. An opto-electronic device as claimed in claim 9, wherein the insulator part of each of said first and second contact means has a thickness defined depending on whether tunneling is desirable or not.

11. An opto-electronic device as claimed in claim 6, wherein the active semiconductor layers include quantum wells.

* * * * *